United States Patent
Hodgson et al.

(10) Patent No.: US 12,474,726 B2
(45) Date of Patent: Nov. 18, 2025

(54) DIGITAL VOLTAGE REGULATOR CURRENT SENSING AND REGULATION

(71) Applicant: Intel Corporation, Santa Clara, CA (US)

(72) Inventors: James Keith Hodgson, Hillsboro, OR (US); Fabrice Paillet, Portland, OR (US); Christopher J. Mandic, Hillsboro, OR (US); Cary Renzema, North Plains, OR (US); Anand Ramasundar, Portland, OR (US); Sami Hyvonen, Beaverton, OR (US); Po-Cheng Chen, Tigard, OR (US); Alex Santiago Rodriguez, Hillsboro, OR (US); Sergio Carlo Rodriguez, Hillsboro, OR (US); Saravanan Ramamoorthy, Beaverton, OR (US); Ruthvin Jeevan Suvarna, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 739 days.

(21) Appl. No.: 17/645,896

(22) Filed: Dec. 23, 2021

(65) Prior Publication Data
US 2022/0113751 A1   Apr. 14, 2022

(51) Int. Cl.
G05F 1/46   (2006.01)
(52) U.S. Cl.
CPC .............. *G05F 1/461* (2013.01); *G05F 1/468* (2013.01)

(58) Field of Classification Search
CPC .................................. G05F 1/461; G05F 1/468
See application file for complete search history.

(56) References Cited

U.S. PATENT DOCUMENTS

| | | | |
|---|---|---|---|
| 10,250,139 B2 | 4/2019 | Wan et al. | |
| 10,488,876 B1 | 11/2019 | Jackum et al. | |
| 11,114,880 B2 * | 9/2021 | Kondo | H02J 7/007182 |
| 11,335,386 B1 * | 5/2022 | Hong | G11C 7/1048 |

(Continued)

OTHER PUBLICATIONS

European Search Report and Search Opinion, EP App. No. 22208918.7, May 22, 2023, 12 pages.

*Primary Examiner* — Jue Zhang
*Assistant Examiner* — Lakaisha Jackson
(74) *Attorney, Agent, or Firm* — NICHOLSON DE VOS WEBSTER & ELLIOTT LLP

(57) ABSTRACT

A reduced-size replica of power gate transistors may be used within a closed-loop voltage regulator to measure the average current delivered by the transistors in the non-replica power gate. The measured current is compared against a known reference current, and a feedback loop is used to modify the gate bias of the power gate and replica power gate transistors. An improved current sensing power gate replica solution may include measuring current from a small replica of the power gate and extrapolating the total current by digitally multiplying the replica current by the ratio of the size of the enabled power gates to the size of the replicas. The current through the replicas, which substantially matches the current in equivalent power gate devices, may be collected on an analog bus and conducted across a known resistor to generate a voltage that determines an estimated current of the power gate devices.

14 Claims, 20 Drawing Sheets

(56) References Cited

U.S. PATENT DOCUMENTS

2018/0292851 A1    10/2018  Mahajan et al.
2023/0261645 A1*    8/2023  Nuebling ......... H03K 17/08128
                                                    327/374

* cited by examiner

- VD1= VSX_TOP - GM1 * AMP_OUT * R2
- CURRENT OF M2 FLOWS THROUGH R2
- GM2 * VD1 = -GM1 * AMP_OUT
- VSX_TOP / AMP_OUT = GM1 * R2 - GM1 / GM2
  = R2 / R1 - GM1 / GM2 = R2 / R1

DIGITAL VOLTAGE REGULATOR CURRENT SENSING AND REGULATION

TECHNICAL FIELD

Embodiments described herein generally relate to digital voltage regulator circuits.

BACKGROUND

Digitally controlled power gates may be used to provide on-die linear voltage regulation. However, when the power gate devices are digitally switched from OFF to fully ON, they may cause the voltage regulator to suffer from several drawbacks. These challenges may include difficulty in maintaining loop stability across operating points, reduced transistor reliability and self-heat issues at high dropout voltage, or unbounded fast transient current steps that can collapse an input power delivery network. The power management features provided by a voltage regulator may also be affected by the accuracy of its current sensor. However, voltage regulator current sensing is typically very process-sensitive. Variations in the process may lead to inaccuracy and repeatability issues, and there are typically steep tradeoffs between power, speed, and accuracy.

An on-die voltage regulator generally requires an accurate current sensor for product safety (i.e., over-current protection), such as to support a system on a chip (SOC) power management goal of optimizing power and performance. Load current is traditionally a difficult parameter to measure because the current in a power delivery network can be non-uniform and because the current flows through unknown resistance in the power grid. When current flows through a power gate within a voltage regulator, the voltage drop across the power gate may be used to infer the current being delivered by the regulator. However, challenges exist in measuring power gate current because of process and voltage variations in on-die sensors and the power gate itself, and because the voltage drop on the power gate may be very small in some cases. These variations and small signals limit the ability of an instrumentation amplifier to measure the dropout of the power gate and extrapolate the current based on that measurement.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which:

FIG. 11 shows the total output current calculated using the Iout expression above as a function of the measured load current from an off-die loading unit.

DETAILED DESCRIPTION

Figure 1:
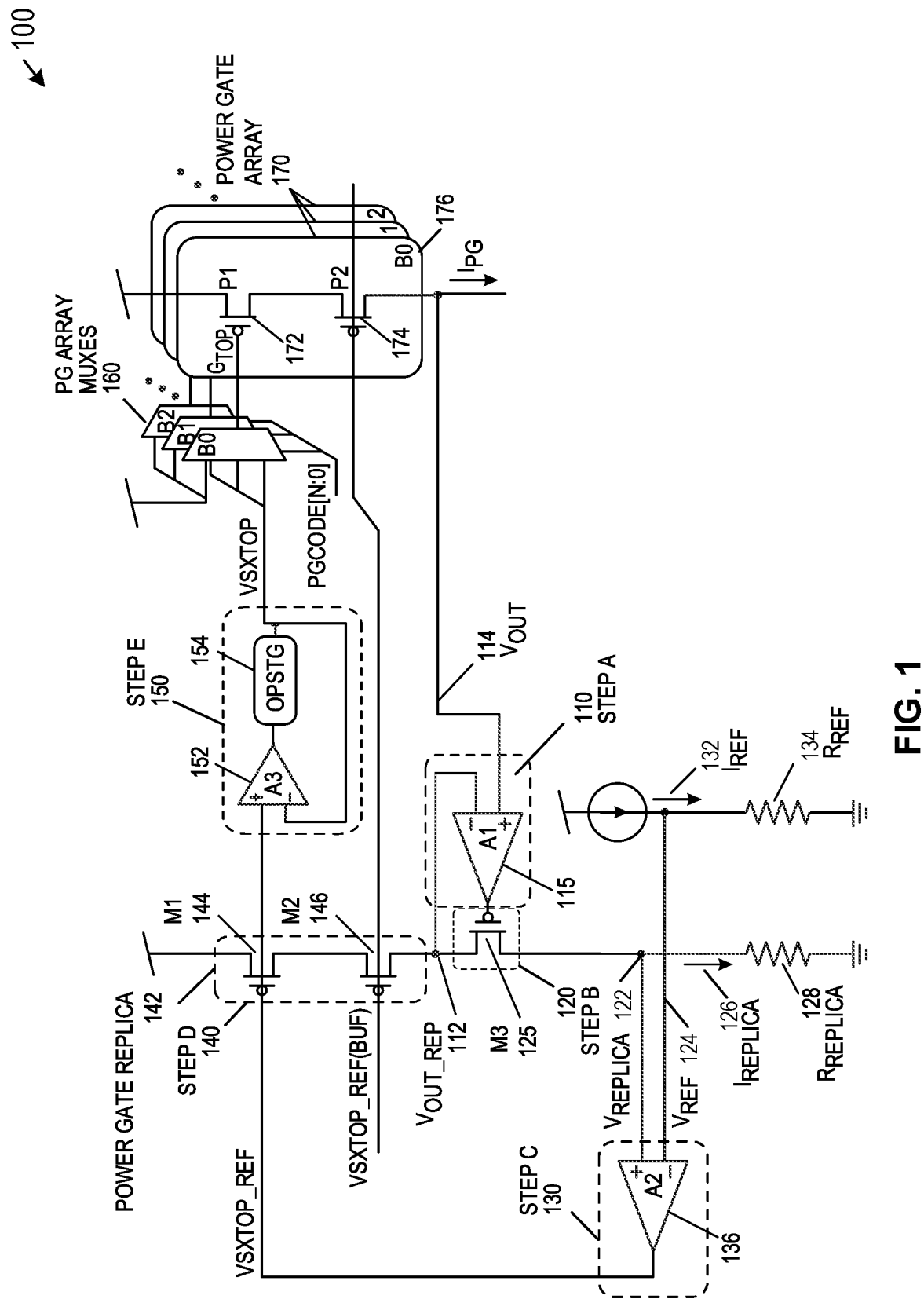
FIG. 1 is a circuit diagram illustrating a power gate replica circuit, according to an embodiment.

The voltage regulators described herein provide technical solutions for technical problems facing power gate devices. In a closed-loop voltage regulator based on a digitally controlled power gate, a reduced-size replica of power gate transistors is used to measure the average current delivered by the transistors in the real (e.g., non-replica) power gate. The measured current is compared against a known reference current, and a feedback loop is used to modify the gate bias of the power gate and replica power gate transistors. The power gate transistors switch ON to a known constant current per branch. This use of a power gate replica to control the current per branch of the power gate provides improved performance, and addresses issues related to unbounded transient input current, transistor self-heat, and loop stability. Limiting the current reduces the metal resource and capacitance requirements of the power delivery network. Limiting the current also reduces or eliminates the probability that the transistors will exceed self-heat limits even with a large dropout voltage. Additionally, because the magnitude of the current per bit of the power gate is stable across dropout voltages, the design of the control loop is greatly simplified.

These power gate replica solutions provide various advantages. The power gate replica solutions provide improved loop stability over solutions that switch to hysteretic control based on output voltage, as hysteretic control does not guarantee that the loop will be stable because the input voltage at the power gate is not well controlled. The power gate replica solutions provide improved reliability and reduced self-heating over solutions that rely on code rotation to avoid violating self-heat limits, where code rotation increases complexity and increases switching current losses. The power gate replica solutions provide improved reliability and reduced self-heating over solutions that rely on device stacking with gate voltage biasing to avoid individual devices exceeding self-heat reliability limits, which bias the gate voltage but do not limit the current in the power gate to a known value. By regulating the current per branch within a power gate array, when load current is held constant while dropout voltage is swept, a constant number of power gate devices will remain ON with linearly increasing power dissipation in each ON branch as the dropout increases. This provides improved performance over unregulated power circuits in which unregulated current will result in fewer power gates ON as dropout voltage increases with power increasing quadratically in the devices that remain ON.

A power gate replica solution may be used to improve the performance of current sensing in a voltage regulator in a manner that is robust against process and temperature. An improved current sensing power gate replica solution may include measuring current from a small replica of the power gate and extrapolating the total current by digitally multiplying the replica current by the ratio of the size of the enabled power gates to the size of the replicas. The improved current sensing solution may include multiple, rotatably-enabled replica power gates distributed periodically within a power gate array. A centralized amplifier may be used to control local source-follower p-channel metallic oxide semiconductor (PMOS) transistors, where the PMOS transistors may be used to regulate the output voltages of the replicas so that they match the output voltage of the power gate. The current through the replicas, which substantially matches the current in equivalent power gate devices, may be collected on an analog bus and conducted across a known resistor to generate a voltage that determines an estimated current of the power gate devices. The resistor voltage may be sensed by an analog-to-digital converter (ADC) and converted to a digital code that can be postprocessed to report out a running total load current to power management. Periodic rotation through replica cells may improve current sensing while reducing inaccurate matching with the power gate average device characteristics due to random device variation, and reducing inaccuracy over time due to accelerated aging of the replica cells when compared to aging in the power gate devices.

In the following description, for purposes of explanation, numerous specific details are set forth to provide a thorough understanding of some example embodiments. It will be evident, however, to one skilled in the art that the present disclosure may be practiced without these specific details.

FIG. 1 is a circuit diagram illustrating a power gate replica circuit 100, according to an embodiment. Power gate replica circuit 100 provides improved voltage regulation by regulating electrical current per power gate transistor within a power gate array 170 so that the current per transistor is substantially constant across a specified range of dropout voltages. FIG. 1 shows the current regulation control loop that is used to regulate the power gate array 170. The power gate array 170 is composed of an array of N binary weighted transistor banks starting with the smallest LSB b0 transistor bank 176 with transistors P1 172 and P2 174, where each successive bank sizes up each successive bit by a factor of two. To regulate current in the power gate array 170, a power gate replica 142 is implemented using transistors M1 144 and M2 146 that are identical in layout to P1 172 and P2 174. The replica cells are physically positioned within the power gate array 174 so that they share the same process characteristics, the same supply voltage, and the same temperature as the power gate transistors. Because the replicas and the power gate cells share the same gate and drain voltage, they will also draw the same current.

The control flow of the power gate replica circuit 100 is described with respect to Step A 110 through Step E 150. In Step A 110, the drain node of the replica transistors $V_{out\_REP}$ 112 and the drain node of the power gate array $V_{out}$ 114 are sensed by amplifier A1 115. In Step B 120, amplifier A1 115 and PMOS transistor M3 125 regulate $V_{out\_REP}$ so that its voltage is equivalent to $V_{out}$ 114. In Step C 130, amplifier A2 136 senses the voltage $V_{replica}$ 122 that is created by the current $I_{replica}$ 126 that comes out of the replica transistors dropping across resistor $R_{replica}$ 128, and the reference voltage $V_{ref}$ 124. The objective of the current reference is to force $I_{replica}$ 126=$I_{ref}$ 132, which occurs when voltage $V_{replica}$ 122=$V_{ref}$ 124. In Step D 140, amplifier A2 136 works to achieve equal currents by adjusting the gate voltage of replica transistor M1 144 in a negative feedback loop so that $V_{replica}$ 122=$V_{ref}$ 124 and therefore $I_{replica}$ 126=$I_{ref}$ 132. In an example, the gate of the replica 142 could theoretically be shorted to the gate node of the power gate array 170 through a common wire and the loop would be complete. However, the power gate array 170 is relatively large and includes substantial capacitance that may significantly reduce the bandwidth of the replica current regulation loop. In Step E 150, amplifier A3 152 and a low impedance output stage 154 are placed in a unity gain configuration to decouple the replica current loop from the loading of the power gate.

Figure 2:
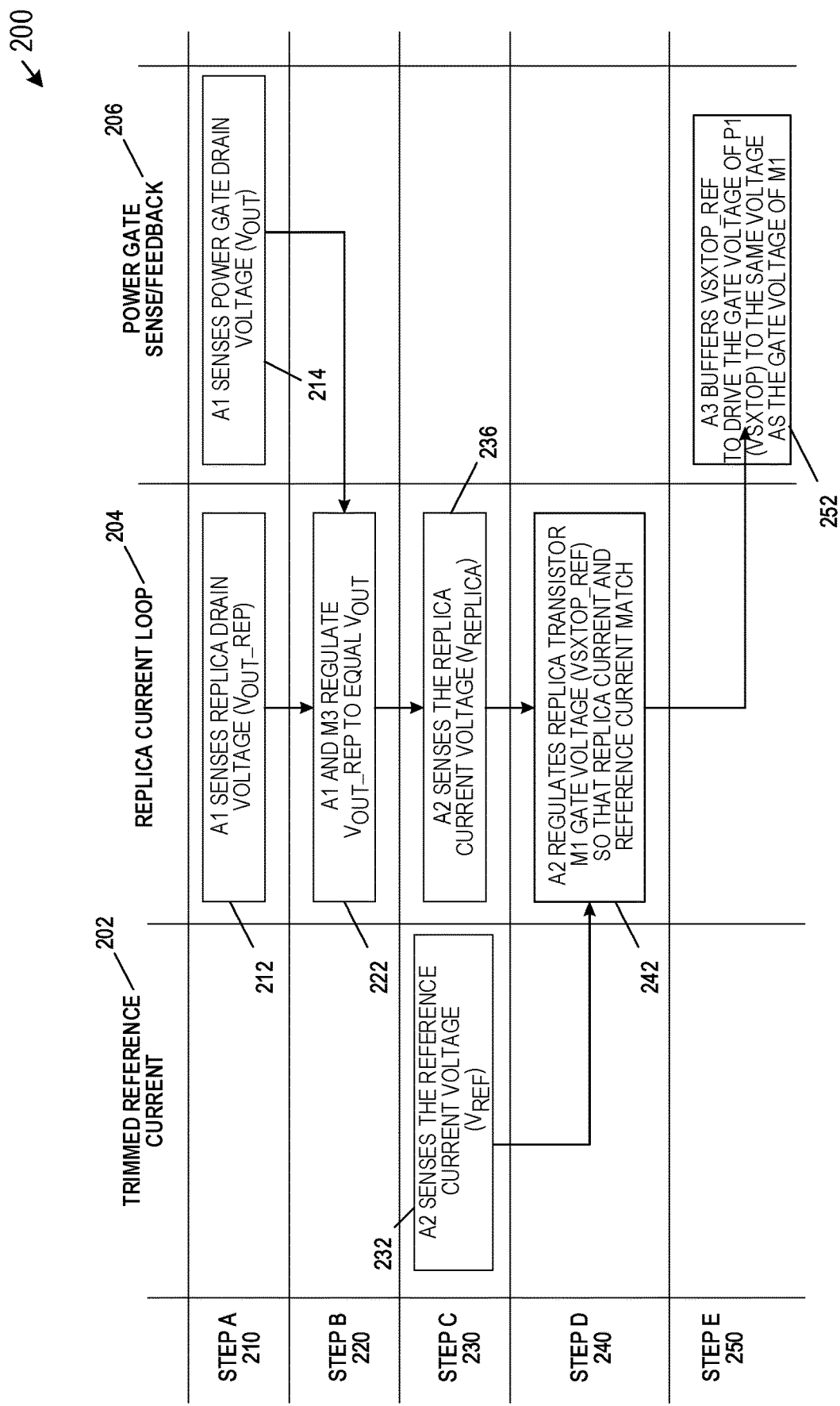
FIG. 2 is a control loop flowchart 200 illustrating a power gate replica control, according to an embodiment.

FIG. 2 is a control loop flowchart 200 illustrating a power gate replica control loop, according to an embodiment. Control loop flowchart 200 summarizes the basic flow of the control of power gate replica circuit 100, including subsequent rows showing Step A 210 through Step E 250. Control loop 200 is also organized into three columns, each denoting the three main systems involved. The first column describes a trimmed reference current ($I_{ref}$) 202 that passes current through resistor (Rref) creating a reference voltage ($V_{ref}$). The second column describes the replica transistor current loop system 204, which forces replica transistors M1 and M2 to provide the same current as $I_{ref}$ while under the same conditions as the power gate transistors P1 and P2. The third column describes the power gate sense and feedback system 206, with its drain voltage sensed and gate voltage driven by the current loop in the replica transistor current loop system 204.

At Step A 210, amplifier A1 senses 212 the drain node of the replica transistors ($V_{out\_REP}$) and senses 214 the drain node of the power gate array ($V_{out}$). In Step B 220, amplifier A1 and PMOS transistor M3 regulate 222 $V_{out\_REP}$ so that its voltage is equivalent to $V_{out}$. In step C 230, amplifier A2 senses 232 the reference voltage $V_{ref}$ and senses 236 the voltage $V_{replica}$ that is created by the current that comes out of the replica transistors ($I_{replica}$) dropping across resistor $R_{replica}$. The objective of the current reference is to force $I_{replica}=I_{ref}$ which occurs when voltages $V_{replica}$ and $V_{ref}$. Step D 240, amplifier A2 works to achieve equal currents by regulating 242 the gate voltage of replica transistor M1 in a negative feedback loop so that $V_{replica}=V_{ref}$ and therefore $I_{replica}=I_{ref}$. In Step E 240, amplifier A3 buffers 252 the gate voltage of the first transistor within the power gate replica, which drives the gate voltage of the first transistor within the power gate array to the gate voltage of the first transistor within the power gate replica. Amplifier A3 may be used with a low impedance output stage in a unity gain configuration to decouple the replica current loop from the loading of the power gate.

Figure 3:
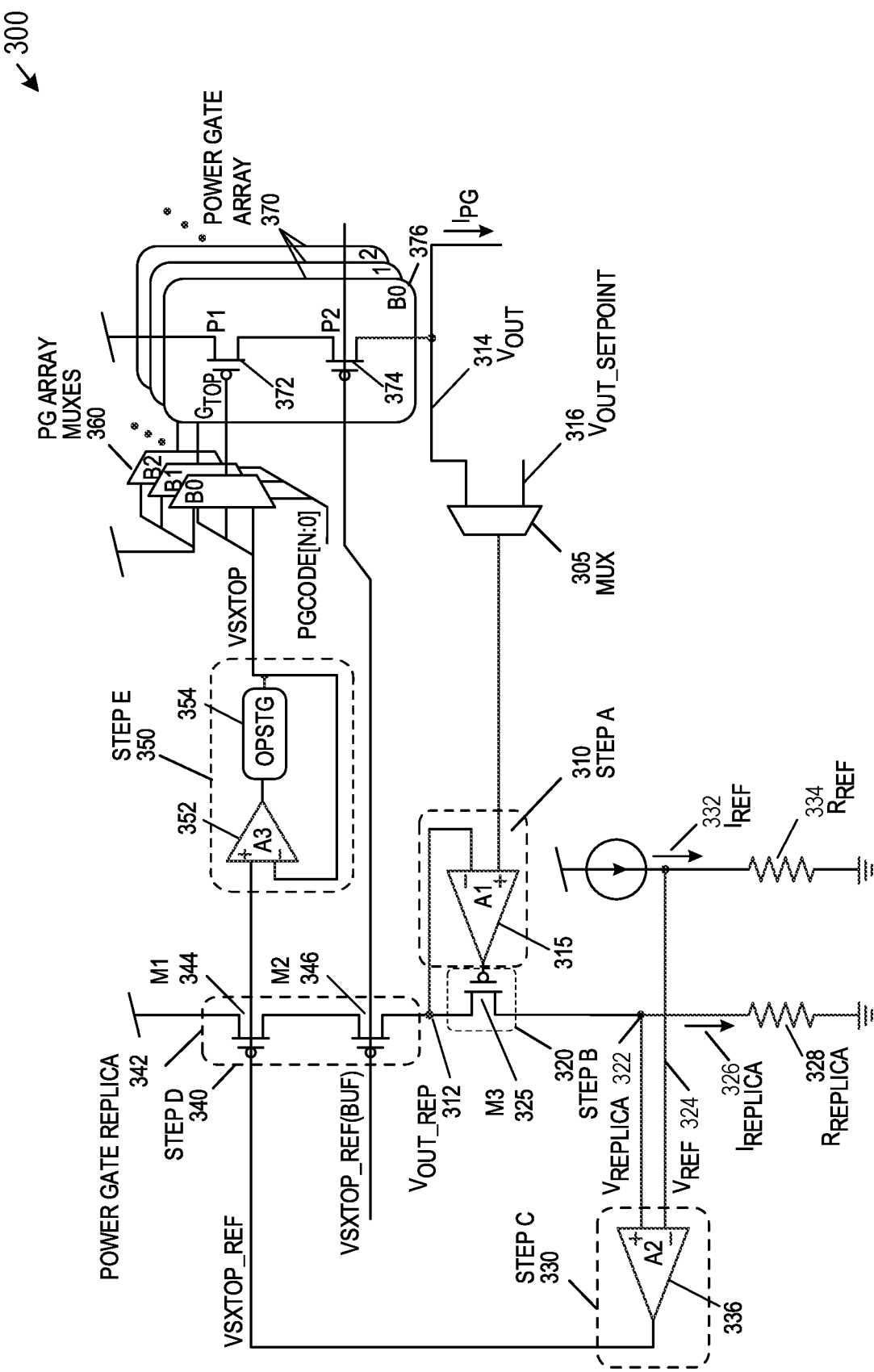
FIG. 3 is a circuit diagram illustrating a modified power gate replica circuit, according to an embodiment.

FIG. 3 is a circuit diagram illustrating a modified power gate replica circuit 300, according to an embodiment. Sensing the drain voltage of the power gate creates a scenario where a drop in the output voltage may cause the current regulation loop to limit the branch current, which may further reduce the total available power gate current and cause the output voltage to collapse. This situation can happen if either the current regulation loop bandwidth is much faster than the voltage regulation loop or if the steady state current of the load exceeds the maximum current that the current limited power gate can supply. The modified power gate replica circuit 300 shown in FIG. 3 includes an additional feature of the current loop that breaks the dependency on $V_{out}$ 314 and prevents a drop in output voltage from triggering the current loop into collapsing the output voltage. At the input of amplifier A1 315, an analog multiplexer (mux) 305 is used to select a reference voltage $V_{out\_setpoint}$ 316 that drives $V_{out}$ 314. If the mux selects $V_{out\_setpoint}$ 316, then the current regulation loop attempts to regulate the replica $V_{out\_REP}$ 312 to the setpoint of the main voltage loop. If the actual output voltage $V_{out}$ 314 falls below the setpoint, the current regulation loop will not react to limit the current in the replica. This will enable the current in the power gate array to exceed the current in the replicas and provide the extra current that the load is drawing.

Figure 4:
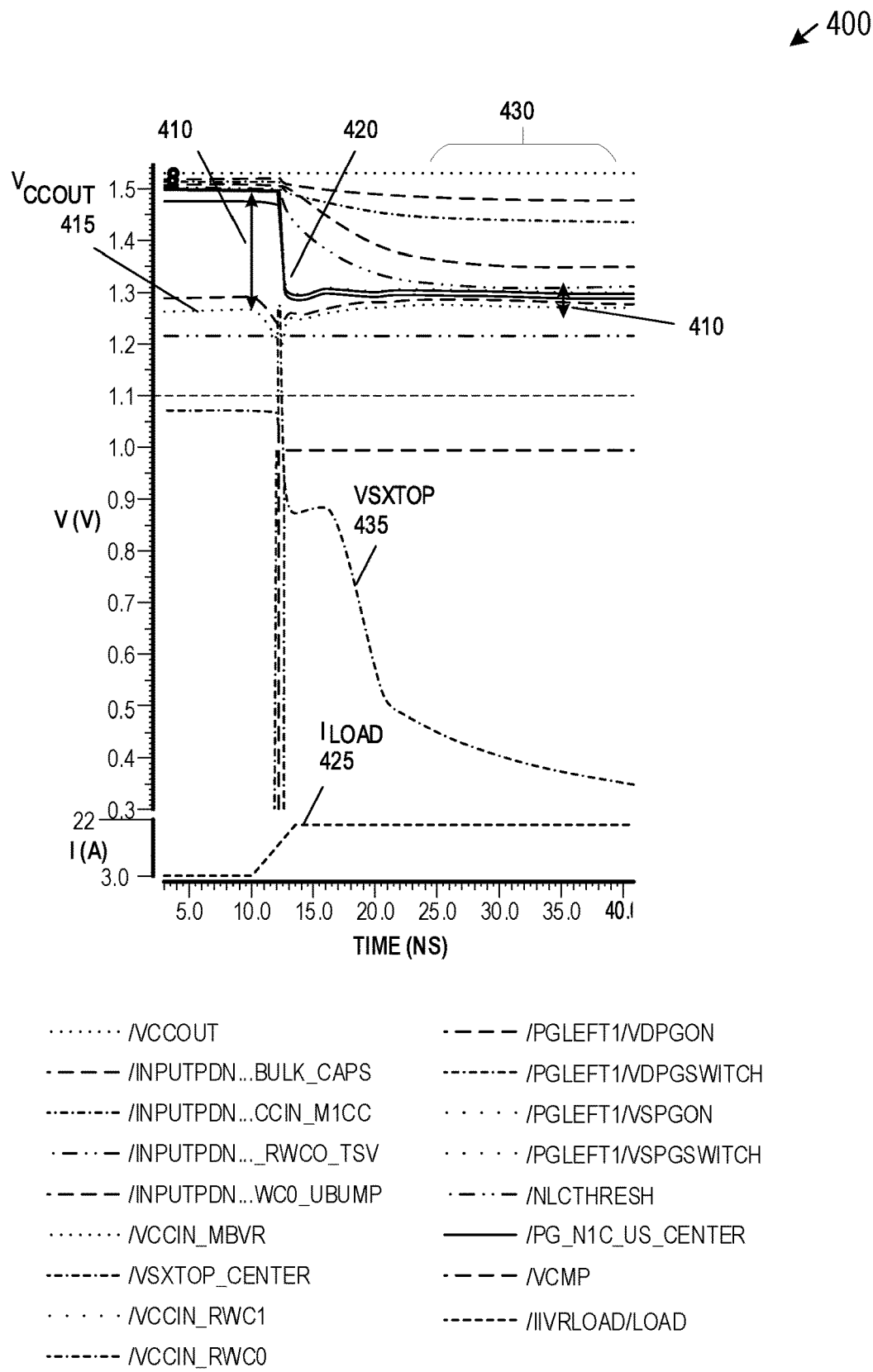
FIG. 4 is a response graph 400 illustrating a digital power gate regulator, according to an embodiment.

FIG. 4 is a response graph 400 illustrating a digital power gate regulator response, according to an embodiment. Response graph 400 shows the response of the current regulation loop to an input voltage droop. The current loop mux (e.g., mux 305 in FIG. 3) is set to the $V_{out}$ setpoint, so the mux is regulating the replica current based on an expected $V_{out}$. The dropout voltage 410 is approximately 220 mV. At time=10 ns, the load current 425 begins ramping up, which causes the output voltage $V_{ccout}$ 415 to fall. A comparator in the main voltage loop senses that $V_{out}$ has fallen below a specified threshold, and the comparator sends a signal to the digital controller to turn on all the power gates in the array. This sharp increase in power gate current pulls the output voltage $V_{ccout}$ 415 up while simultaneously discharging the input power delivery network, causing the input voltage to fall. The replica transistors see this reduced voltage at their source and start to conduct less current, causing the current loop to react by lowering vsxtop 435. In recovery region 430, the output voltage $V_{ccout}$ 415 has recovered to its original level before the load current increase, but the input voltage is still reduced and recovering very slowly. The dropout voltage 410 has fallen from 220 mV to 70 mV so vsxtop is driven low by the current regulation loop as it tries to increase the channel conductance of the replica transistors to bring the current branch back up to the level set by $I_{ref}$.

Figure 5:
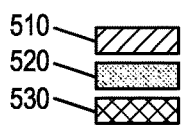
FIG. 5 is a temperature plot 500 illustrating transistor fin self-heat (FiSH), according to an embodiment.

FIG. 5 is a temperature plot 500 illustrating transistor fin self-heat (FiSH) temperature, according to an embodiment. Temperature plot 500 shows the advantage of the digital regulator using regulated versus unregulated power gate current for a given process node. Each cell in temperature plot 500 shows the temperature in ° C. as a function of dropout voltage (VDS) across the power gate and the channel current (IDS) per power gate device. The self-heat temperature of transistor fins is directly related to the power dissipation in the transistors, which is the product of dropout voltage and channel current. The cells show one of three operation regions: a safe FiSH temperature range 510 below 40° C., a marginally safe temperature range 520 of 40° C.-60° C., and an unsafe temperature range 530 that violates reliability temperatures limits of 60° C.-400° C.+.

As can be seen in FIG. 5, the unregulated FiSH temperature 540 of an unregulated transistor increases quickly into the unsafe temperature range 530. In unregulated operation, the power gate transistor is turned on as much as possible by pulling the gate voltage as low as possible. As the dropout voltage increases from 0 V, the channel current increases linearly due to the high channel conductivity, and power dissipation rises approximately as the square of the dropout voltage. The unsafe temperature range 530 is reached with only a few hundred mV dropout. In contrast, the regulated FiSH temperature 550 remains within the safe FiSH temperature range 510 and the marginally safe temperature range 520. In regulated operation, the current rises with dropout voltage until enough voltage headroom is reached for the current regulation loop to begin limiting the current. In an example, the trimmed reference current may be 20 uA per transistor, and the current replica loop regulates the channel current to 20 uA for all dropout voltages. This causes the FiSH temperature to rise linearly with dropout voltage. In addition to the reduced temperature rise as a function of dropout voltage, this regulated current provides increased control over how much current to target, which may provide additional safety and design flexibility in case of process shifts or reliability limit changes.

Figure 6A:
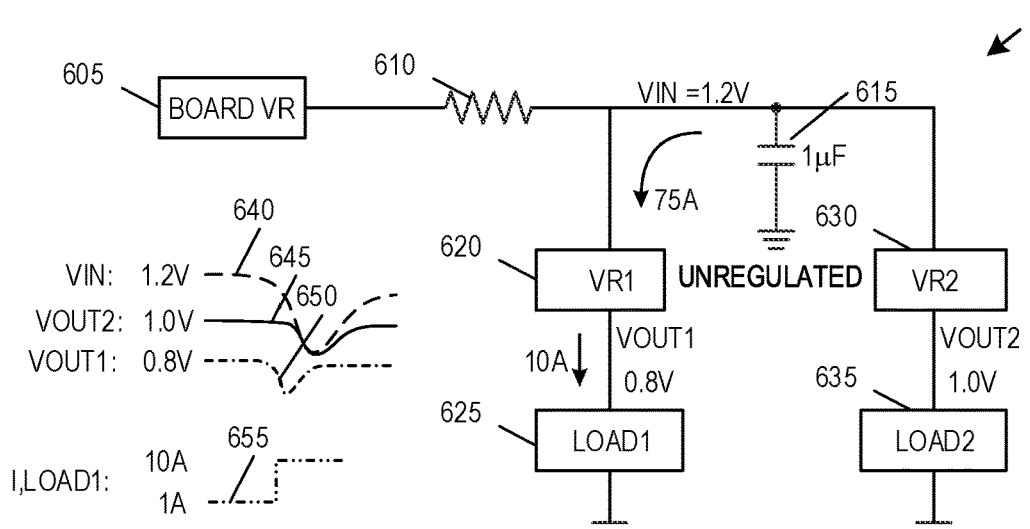
FIGS. 6A-6C are circuit diagrams 600 illustrating benefit to power delivery, according to an embodiment.
Figure 6B:
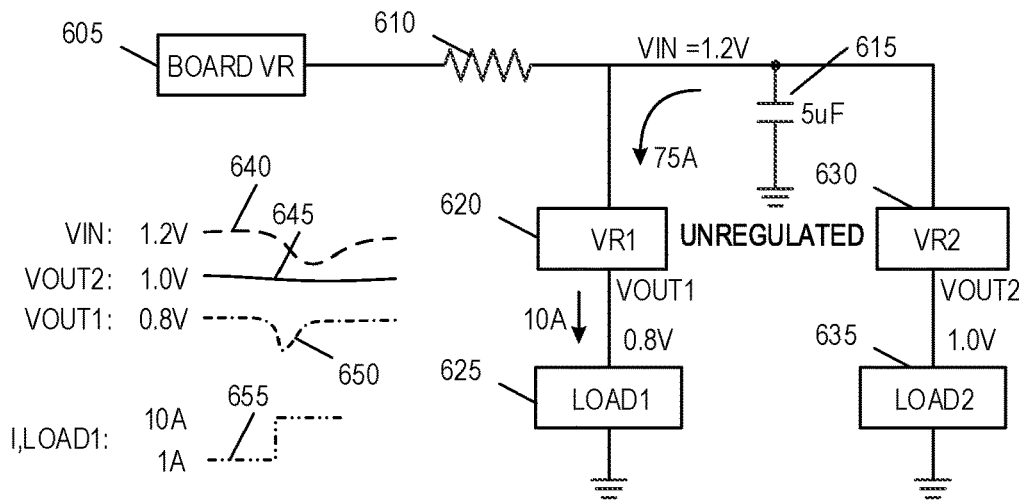
Figure 6C:
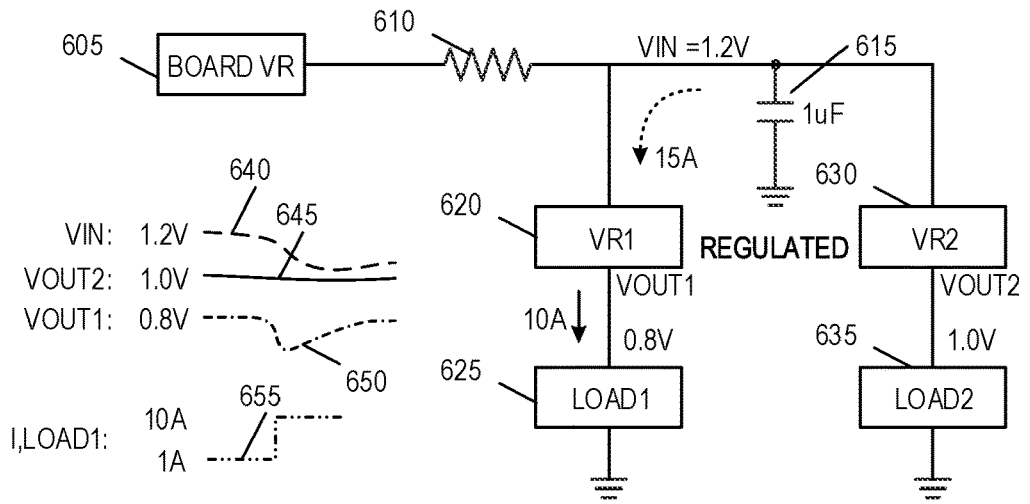

FIGS. 6A-6C are circuit diagrams 600 illustrating benefit to power delivery network, according to an embodiment. FIG. 6A shows the response with an unregulated power gate current and small input decoupling capacitor 615. FIG. 6B shows the response with an unregulated power gate current with large input decoupling capacitor 615. FIG. 6C shows the response with a regulated power gate current with small input capacitor 615. As shown in circuit diagrams 600, two voltage regulators VR1 620 and VR2 630 are connected to the same input supply $V_{in}$ 615 are supplying static current to their respective loads Load1 625 and Load2 635 at different voltages, such as 0.8 V for Load1 625 and 1.0 V for Load2 635. In operation, when Load1 625 increases its current requirement from 1 A to 10 A, this causes voltage $V_{out1}$ 650 to begin to droop. VR1 620 senses the large voltage deviation from its setpoint and quickly turns on its entire power gate in an attempt to restore the output voltage.

FIG. 6A shows the response with an unregulated power gate current and small input decoupling capacitor 615. Though the current load 655 only requires 10 A, the dropout voltage of the VR1 620 at 400 mV is relatively large, so its power gates conduct 75 A from the input. While the inrush current does stop the droop at $V_{out1}$ 650 and very quickly restore the voltage to the setpoint, it discharges the local 1 µF $V_{in}$ capacitor 615 so much that $V_{in}$ 640 droops below the voltage setpoint of VR2. This causes $V_{out2}$ 645 to temporarily droop with it until $V_{in}$ 640 recovers, which takes time because of the resistance between it and the board voltage regulation.

FIG. 6B shows the same scenario as FIG. 6A except that the input capacitor 615 has been increased to 5 µF. While this mitigates the droop induced on VR2 630, the downside is the extra cost and resources required to have the extra capacitance. FIG. 6C shows the same as FIG. 6A, except that VR1 620 and VR2 630 have current regulated power gates. When VR1 620 turns on all its power gates to catch the droop, the inrush current is not dictated by the dropout voltage, but by the current regulation circuit. The circuit may be designed based on a predetermined maximum current that can be supplied by VR1 620 and VR2 630 (e.g., 15 A, which guarantees that fast currents cannot exceed a predetermined maximum value. Because the current is bounded, the input capacitor requirement may be reduced while still meeting the droop requirement. While the magnitude of the droop of $V_{out1}$ 650 is the same using each of the circuits in FIGS. 6A-6C, the recovery time back to the setpoint using the circuit in FIG. 6C is slower because the current is limited. However, digital architectures set their performance voltage guard bands based on worst case droop, not on recovery time, so the slower recovery is an acceptable tradeoff for providing reduced power delivery network costs.

These current regulation solutions provide the ability of a digital power gate array to sense its own current. By regulating the current per branch to a known value and then multiplying by the number of branches enabled at a given time, the total current is being delivered to the load may be determined. This current regulation provides improved accuracy of the digital current sensor. The limitation of the digital current sensor range is the available headroom. For instance, when the power gate dropout is low and the $V_{sxtop}$ node saturates as low as voltage overstress limits allow, then the current per branch may be reduced below the reference current and the digital current sensor may become inaccurate. The digital power gate regulation may still be used without adversely affecting reliability or incurring instability. In particular, reliability is maintained at low dropouts because there is no issue with fin self-heat, and stability is maintained by reducing the loop gain due to lower power gate output resistance.

Figure 7:
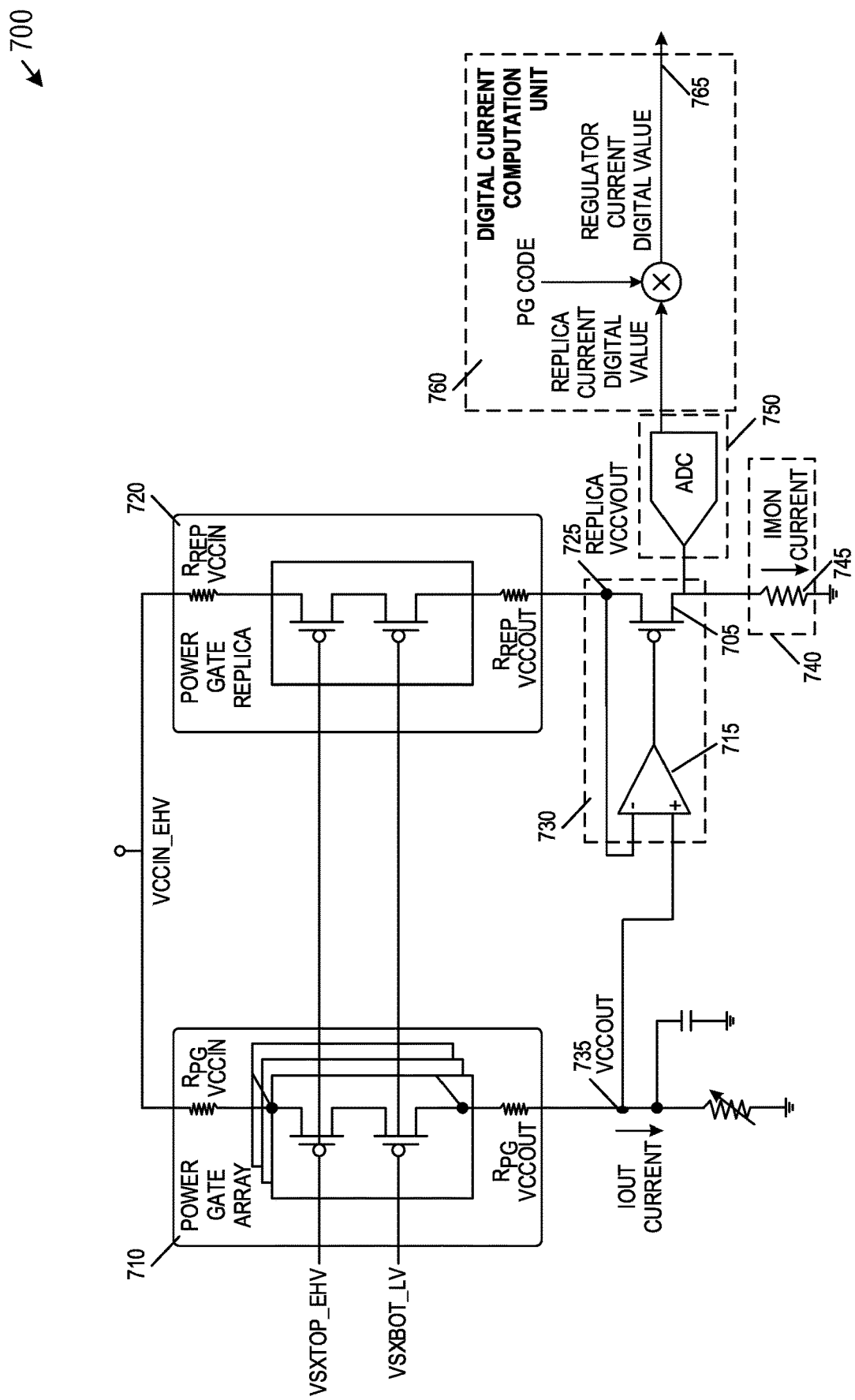
FIG. 7 is a circuit diagram illustrating a current-sensing digital voltage regulator, according to an embodiment.

FIG. 7 is a circuit diagram illustrating a current-sensing digital voltage regulator 700, according to an embodiment. Regulator 700 may include a power gate array 710 and one or more power gate replicas 720. Multiple instances of power gate replicas 720 that are identical in layout to a fundamental unit of the power gate array 710, except that an output node of the power gate replicas 720 is connected to a voltage-regulating transistor 705, such as a PMOS source follower. A regulation loop 730 may include the voltage-regulating transistor 705 and amplifier 715, which may be used to control the voltage-regulating transistor 705 in closed loop so that the replica output node voltage 725 tracks the power gate output node voltage 735. The regulation loop 730 may be connected by an analog bus (e.g., thick wire) to a replica current collection 740, which may carry the current from the regulated replicas into a central resistor 745 to convert the current into a voltage. An ADC 750 may be used to convert the voltage of the load resistor to a digital code representing the sum of the current sourced by the replicas. A digital computation unit 760 may receive the replica current digital value from the ADC 750, multiply the replica current digital value by a ratio of the size of enabled power gates within the power gate array 710 to the size of the power gates within the power gate replica 720, and generate a total regulator current digital value 765. The total regulator current digital value 765 may represent the sum total current of the digital regulator 700.

To keep each power gate replica 720 small so that it does not consume too much current, the number of transistor legs in each power gate replica 720 may be selected to be smaller than the number of transistors in the equivalent minimum unit area of the power gate array 710. The means the current density of the metals feeding the current in and out of the power gate replica 720 is lower than in the same unit of power gate array 710, which in turn means the voltage drop on the grids will be different. The problem with this is that any difference in the environment of the replicas versus that of the power gates will cause a mismatch between them. For a power gate replica 720, the power grid of the replica transistors may include resistors on the source and drain nodes. Regulator 700 provides the ability to match the replica power grid with the same unit size power grid in the power gate array 710. In an example, this matching of the replica power grid with the same unit size power grid in the power gate array 710 may be implemented by removing vias from some metal layers or by rerouting upper metals back down one layer before routing up again to the top metal. This increases the resistance of the grid, which compensates for lower current density and maintains the equivalent source and drain voltages between the power gate array 710 and each gate replica 720.

Figure 8A:
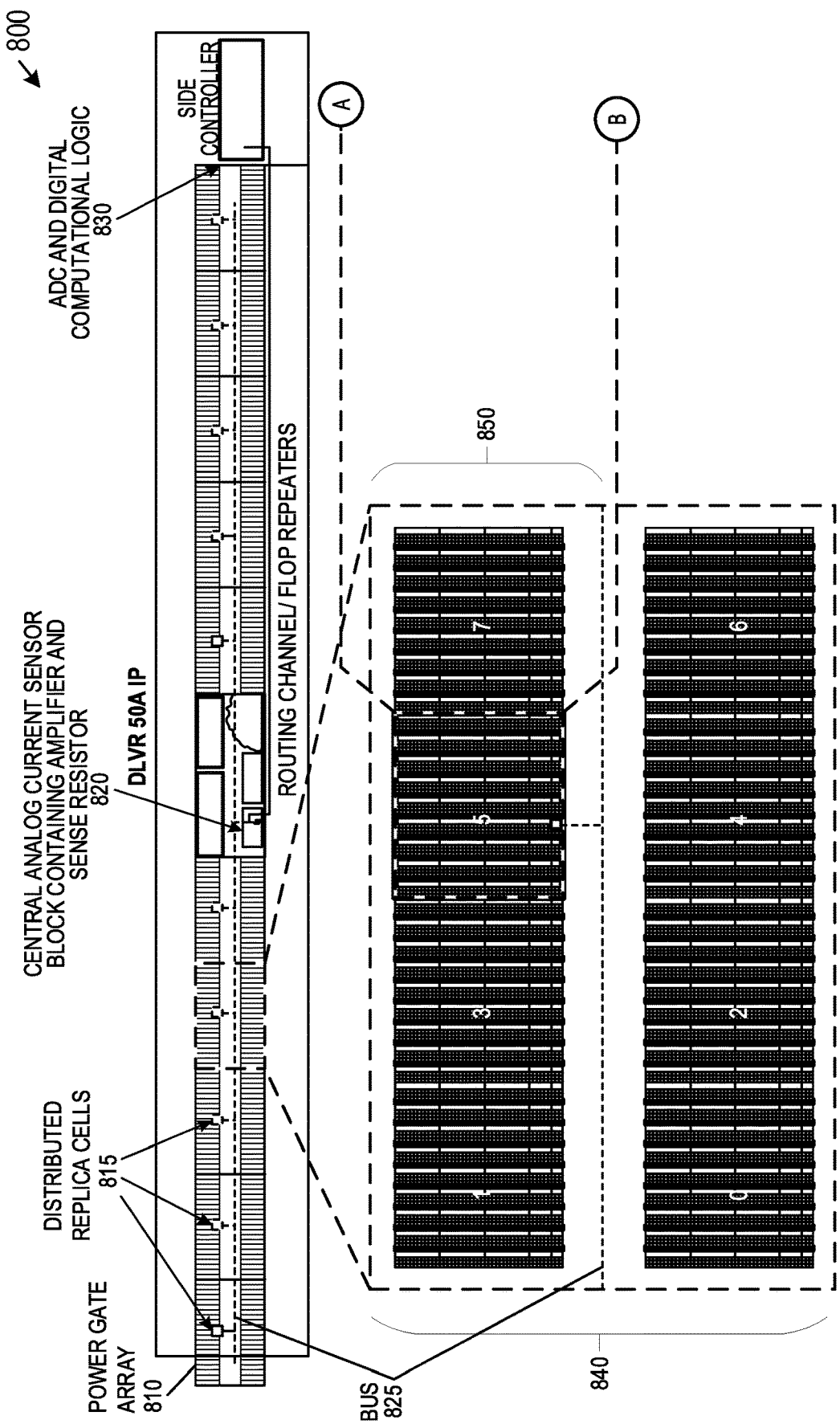
FIGS. 8A-8B are block diagrams illustrating a digital voltage regulator (DLVR) floorplan, according to an embodiment.
Figure 8B:
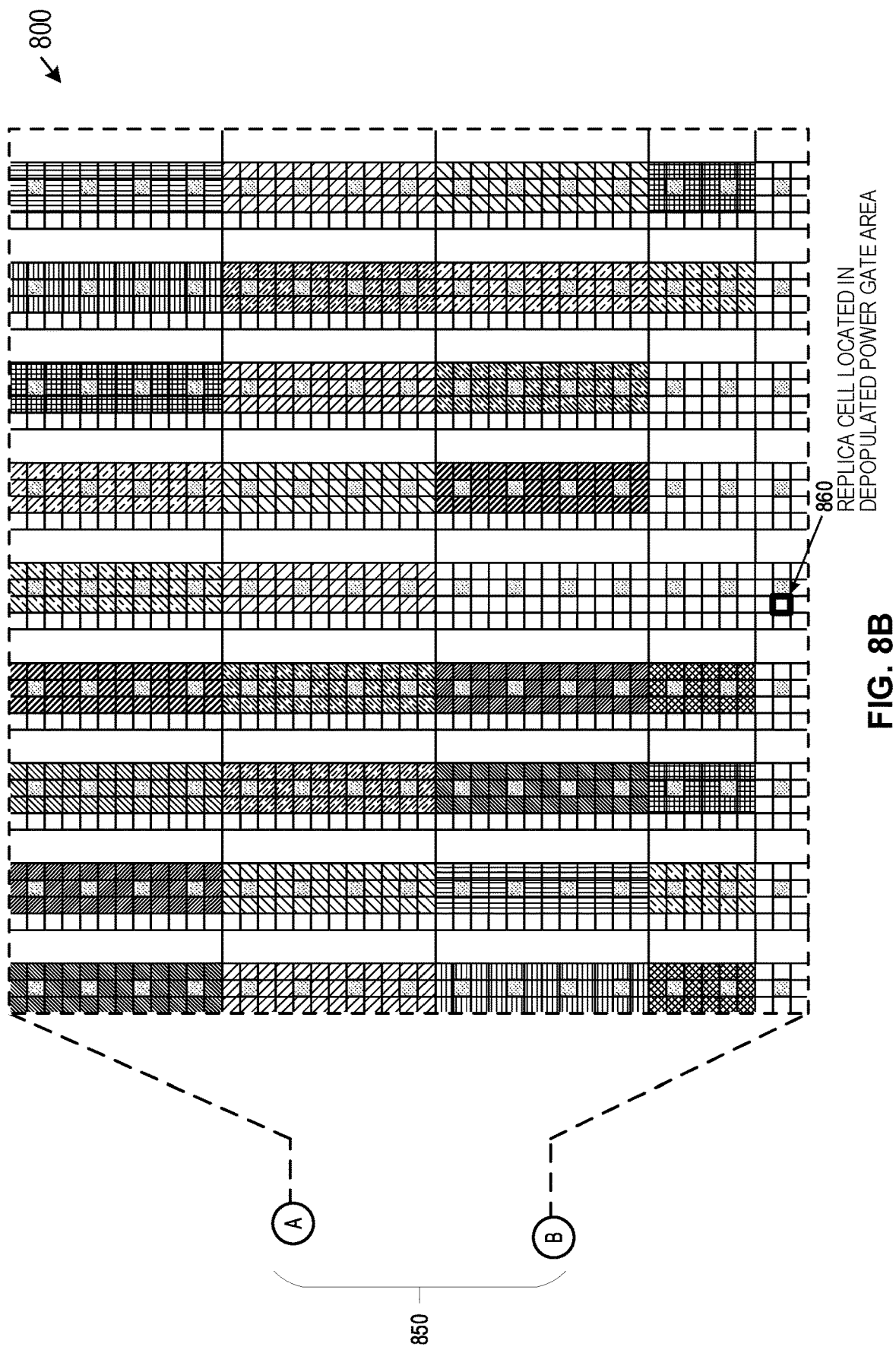

FIGS. 8A-8B are block diagrams illustrating a digital voltage regulator (DLVR) floorplan 800, according to an embodiment. FIG. 8A shows a DLVR floorplan 800 that includes multiple replica cells 815 distributed across the length of the power gate array 810. A power gate array subset 840 shows eight example power gate areas, and FIG. 8B shows one power gate array 850. As shown in FIG. 8B, a replica 860 may be located within a depopulated power gate area. Voltage-regulating transistor may be co-located with their respective replica cells 815, and the output of the central amplifier may be driven in parallel with gate nodes of the voltage-regulating transistors. Each of the replica cells 815 feed their current through their voltage-regulating transistors into a central bus 825 that delivers the sum total of the replicas' current to a load sense resistor in the central block 820. A sense wire may be used to probe resistor voltage and delivers that signal to the ADC and computational logic 830.

Figure 9:
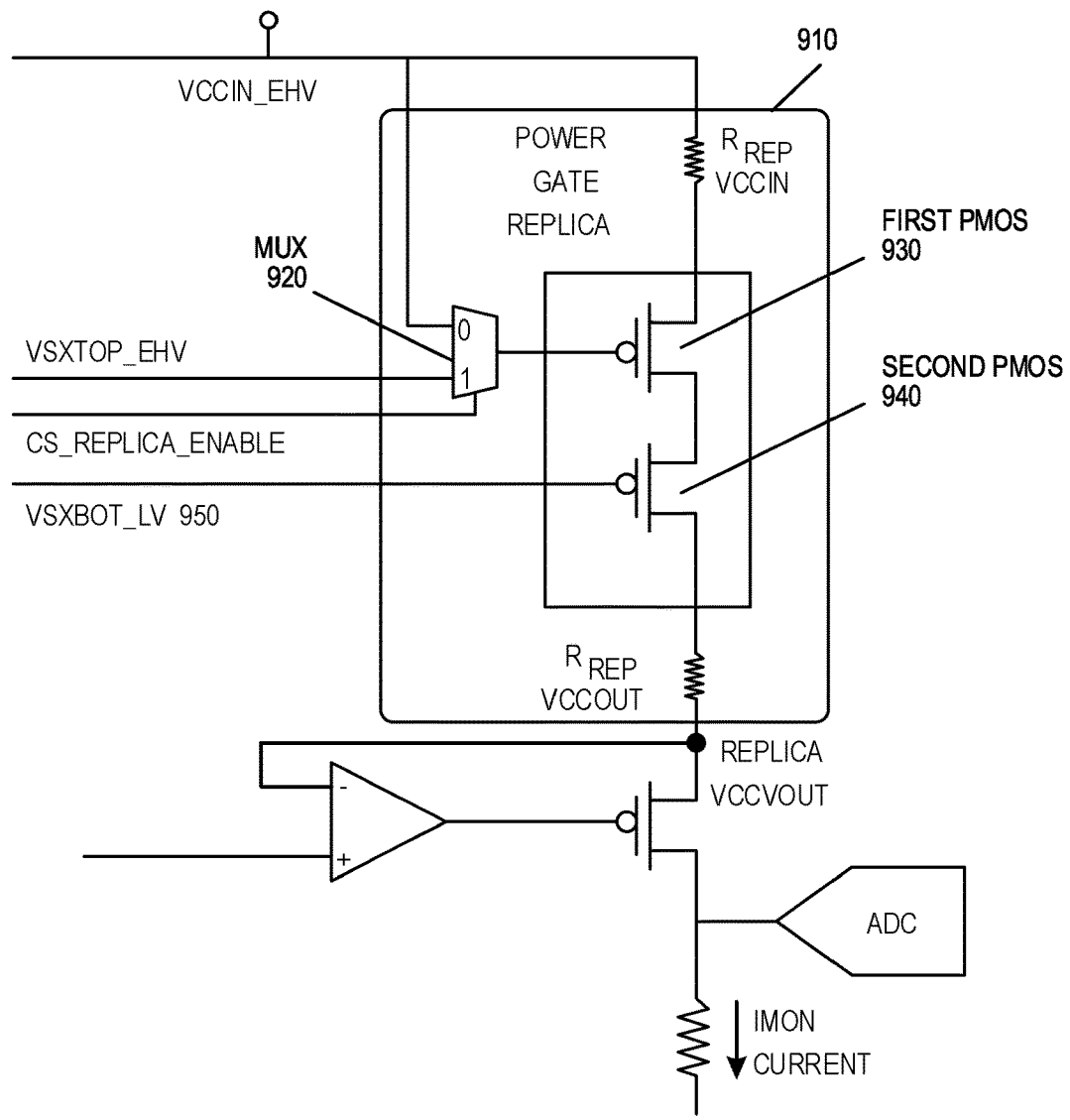
FIG. 9 is a circuit diagram illustrating a replica circuit, according to an embodiment.

FIG. 9 is a circuit diagram illustrating a replica circuit 900, according to an embodiment. Replica circuit 900 may include a power gate replica 910 that may be used for current sensing. One or more of the current-sensing power gate replicas 910 may be disabled when not needed, even with the input supply voltage is turned on. To turn off a power gate replica 910, a high voltage isolation mux 920 may be used to pull a gate node of a first power gate transistor 930 up to an input supply voltage. The high voltage isolation mux 920 is similar to a mux that is used to turn on and off the non-replica power gate cells. When the current sensor is disabled, the voltage of each internal node of the replica branch is clamped to around the gate voltage of the second power gate transistor 940. In the corresponding power gate array, the vsxbot voltage rail 950 may be designed to protect the power gate devices from electrical overstress, so the current-sensing power gate replicas 910 also protected from high voltage overstress when it is shut down.

Each of the current-sensing power gate replicas 910 may be small compared to the power gate. Unlike the large power gate that includes subcomponents that are on and off depending on load conditions, the current-sensing power gate replicas 910 are always-on while the current sensor is on. To reduce or eliminate issues caused by random variation and increased aging due to the small size and always-on nature of the replicas, a set of replicas may be instantiated in the power gate array, which may be enabled in rotation sequence by a controller code. The enablement rotation sequence of replicas is performed as a function of the ADC clock. In an example, the replicas may rotate duty every four ADC clock cycles during the slowest rotation sequence, and may rotate a set of four replicas will all within one ADC clock cycle during the fastest rotation sequence. Increased rotation rate reduces random variation on a cycle-by-cycle basis, and does not affect aging or long-term current summing. Increased rotation rate may introduce minor errors into current measurement each time a replica is rotated on or off, so the rotation rate may be capped at once per replica per ADC sample.

Figure 10:
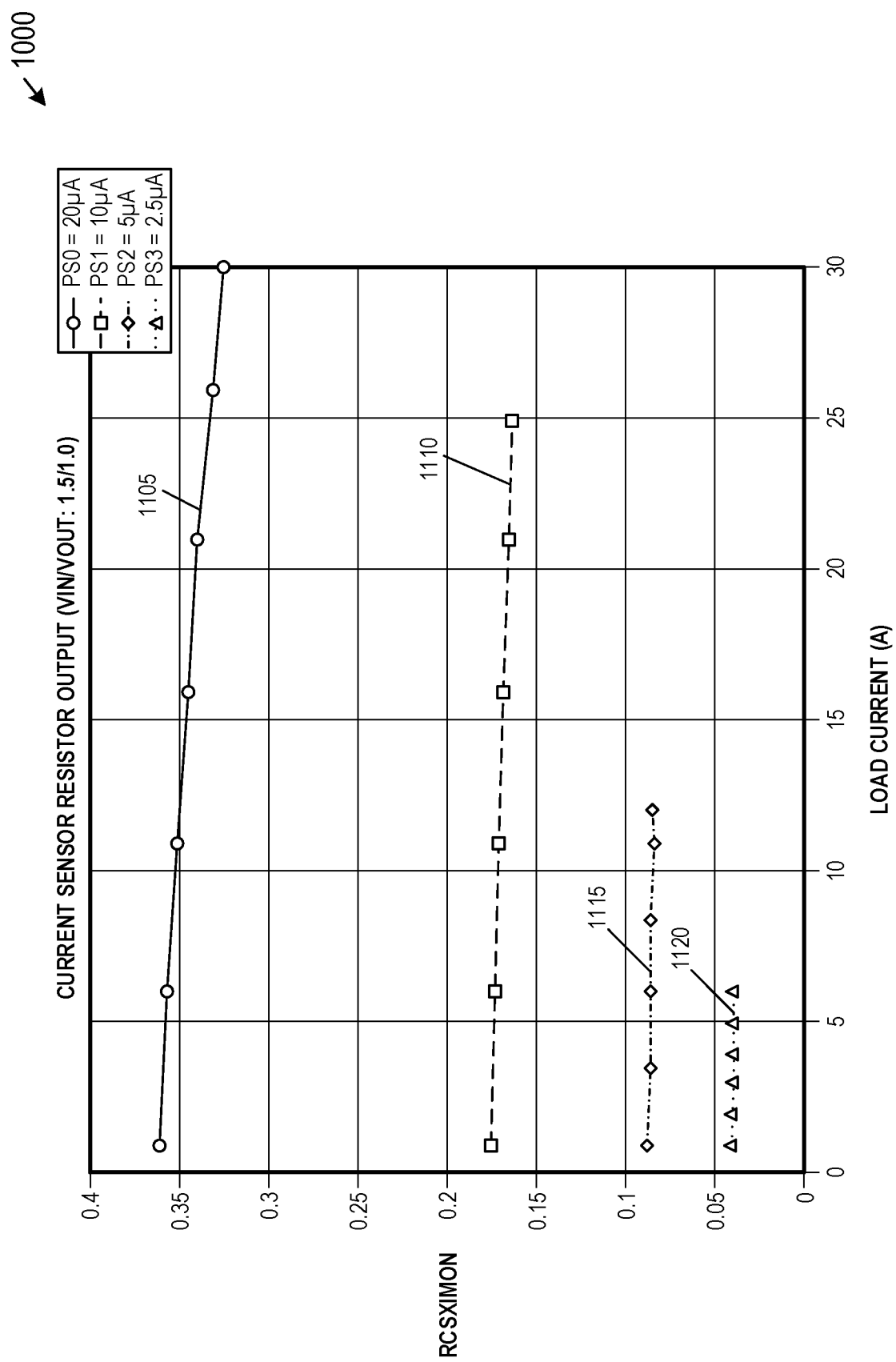
FIG. 10 is a graph illustrating a current sensor analog output, according to an embodiment.

FIG. 10 is a graph illustrating a current sensor analog output 1000, according to an embodiment. The current sensor analog output 1000 shows the current sensor analog voltage output going to the ADC as a function of load current for four power states PS0 1105 through PS3 1120. The regulated current loop maintains the current per branch in the power gate as a factor of 2× per power state, which may be flat across load currents. Non-idealities in both the current loop and the current sensor may be observed at high load currents, such as in the higher current loads in PS0 1110. Each power state may be targeted to increase the current in the power gate branches by 2× as the power state reduces from PS3 1115 (e.g., 2.5 µA per branch) to PS0 1110 (e.g., 20 uA per branch). If current regulation in each power state were perfect and the current sensor error were zero, then each line would be flat. However, current regulation may exhibit some issues at high currents due to increased temperatures and reduced voltage headroom. The current sensor may be designed to account for these irregularities and to improve matching between the replica and the real power gates.

Figure 11:
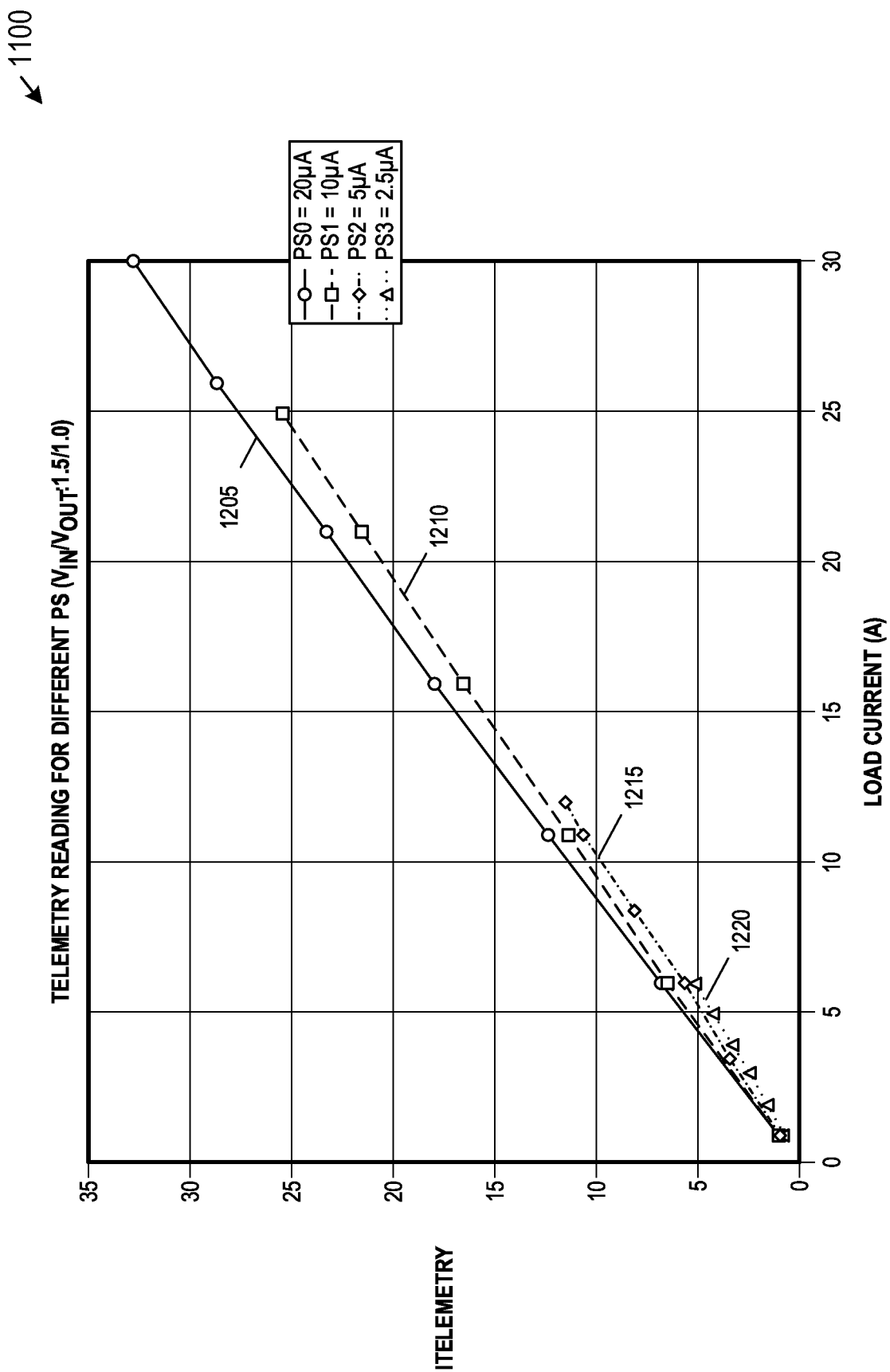
FIG. 11 is a graph illustrating a telemetry reading, according to an embodiment.

FIG. 11 is a graph illustrating a telemetry reading 1100, according to an embodiment. The telemetry reading 1110 indicates a current sensor postprocessed digital readout of total load current with no slope or offset correction for four power states PS0 1205 through PS3 1220. PS1 1210, PS2 1215, and PS3 1220 are within 5% of the expected value. PS0 1205 indicates an approximately 10% error, which may be caused by power grid mismatches aggravated by high branch currents.

The ADC and digital post-processing may be completed using various methodologies. The speed requirement of the ADC may depend on expected dynamic changes in the power gate branch current. When the speed is unbounded, then an ADC bandwidth may be selected based on an assumption that there may be a short-term error in the multiplication of power gate code and branch current readings. The raw output of the ADC is indicated by the digital readout of the analog signal, such as shown in FIG. 10. The total load current is multiplied by the number of power gates that are enabled, which is set by the digital voltage loop of the regulator. The expression for the load current in each digital controller clock cycle may be given by the following equation:

$$I_{out} = \left( \frac{\left( \frac{PG\ Slices\ On}{Module} \right)_{3b}}{8} \cdot \frac{PG_{code,15b}}{2^{15}} \cdot \frac{ADC_{out,10b}}{2^9} \cdot \frac{Slope\ Correction_{11b}}{2^9} + \frac{Offset\ Correction_{8b}}{2^9} \right) \cdot I_{CCMAX}$$

In the equation above, "PG Slices On/Module" is the number of slices of power gate enabled per module, "PGcode" is the output of the digital controller that enables a precise amount of power gate, "ADCout" is the digital output of the ADC reading the current sensor, "Slope Correction" is a trimmed coefficient to correct slope errors, "Offset Correction" is a trimmed static addition to correct offset errors, and "Iccmax" is the nominal maximum current the regulator can deliver.

FIG. 11 shows the total output current calculated using the Iout expression above as a function of the measured load current from an off-die loading unit. Because the slope and offset are not calculated on a per power state basis, there is an error between the power states. This error is increased in the high current PS0 1205, in which the high temperature effects, reduced voltage headroom, and grid mismatches are most pronounced. Even with no correction, the current sensor in PS1 1210, PS2 1215, and PS3 1220 are within 5% of the expected value, and higher error PS0 1205 is within approximately 10% of the expected value.

Figure 12:
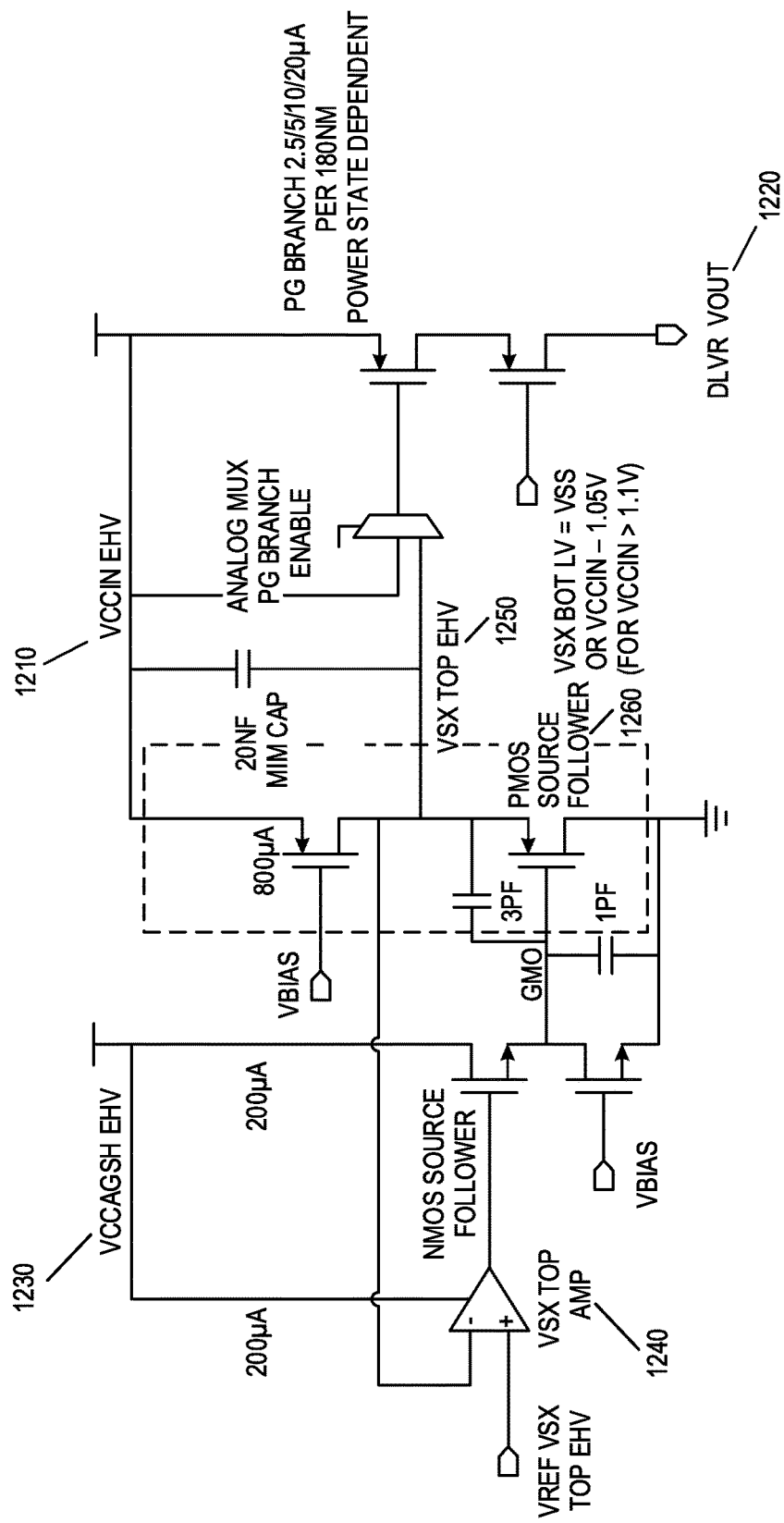
FIG. 12 is a circuit diagram illustrating a PMOS source follower regulation circuit, according to an embodiment.

FIG. 12 is a circuit diagram illustrating a PMOS source follower regulation circuit 1200, according to an embodiment. A given DLVR power gate array may consist of millions of digitally controlled PMOS current sources (e.g., branches). A replica may be used to generate a bias voltage based on the input branch extra-high voltage (EHV) VCCIN_EHV 1210 (e.g., input power supply) and the DLVR $V_{out\ 12}$ 20. A reduced DLVR $V_{out}$ 1220 (e.g., to a processor) may be desirable in low-power applications, and DLVR efficiency may be improved as dropout decreases (e.g., a decrease in VCCIN_EHV 1230–DLVR $V_{out12}$ 20).

A bias voltage to the PMOS power gates may be applied with a buffer amplifier 1240 to drive the VSX TOP EHV rail 1250. This rail may have a large amount of metal-insulator-metal (MiM) capacitance and a low impedance to absorb current spikes. As the DLVR regulates, individual power gates may be switched ON and OFF. Switching power gates ON will inject a switch capacitor current onto the VSX TOP EHV rail 1250. Any voltage spikes on this rail may be applied to the gates of all the power gates that are switched ON and may lower their currents temporarily. Because of the large amount of MiM capacitance and low bias current on VSX TOP EHV rail 1250, the output pole may be at ~800 KHz, and this output pole is the dominant pole. VSX TOP EHV rail 1250 may be regulated with a PMOS source follower 1260, however VSX TOP EHV rail 1250 may be limited to VSS+1 PMOS VGS.

Figure 13:
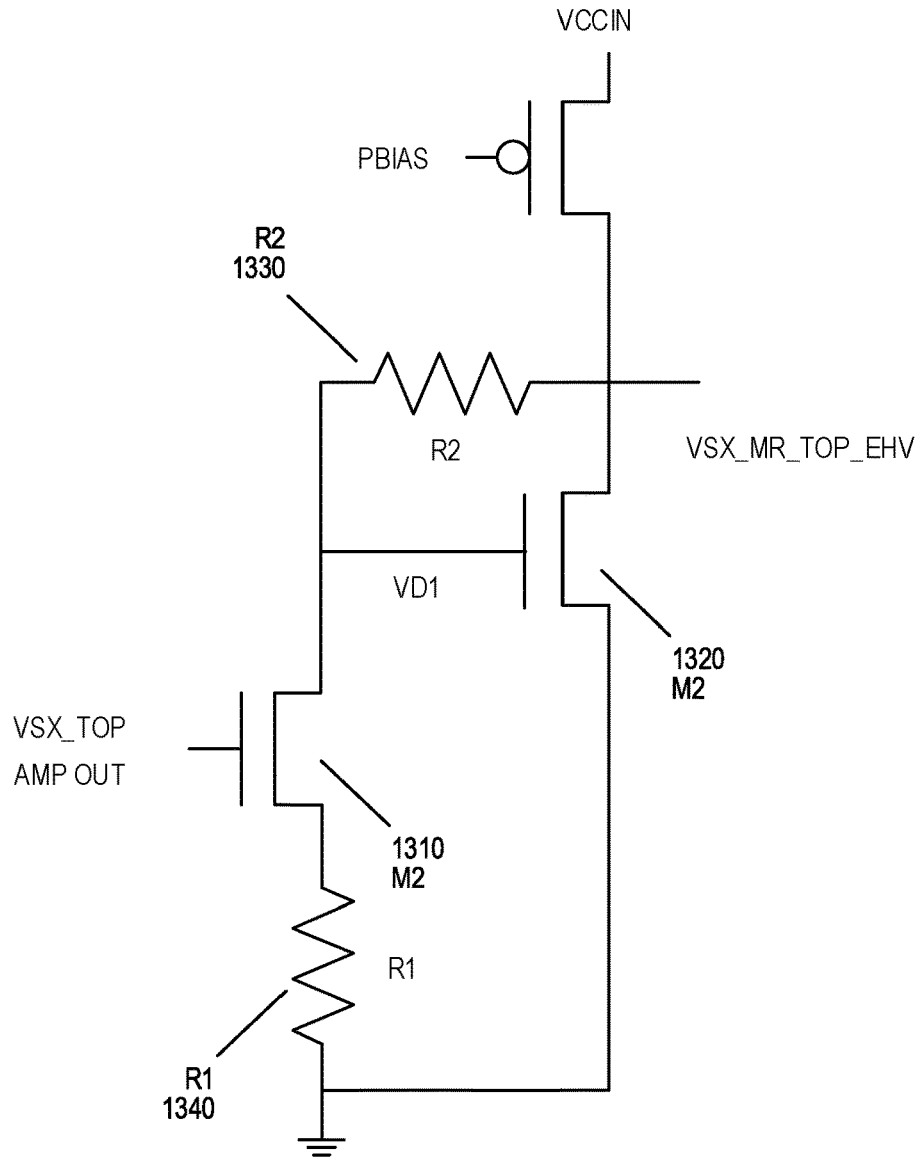
FIG. 13 is a circuit diagram illustrating a modified Cherry-Hooper amplifier, according to an embodiment.

FIG. 13 is a circuit diagram illustrating a modified Cherry-Hooper amplifier 1300, according to an embodiment. Amplifier 1300 may include two cascaded NMOS common source transistors M1 1310 and M2 1320. The gain of amplifier 1300 may be controlled by the ratio of resistor R2 1330/R1 1340. Amplifier 1300 may significantly reduce the output impedance, and the cascaded M1 1310 and M2 1320 may behave similar to a PMOS source follower and be used to regulate a voltage close to VSS.

Figure 14:
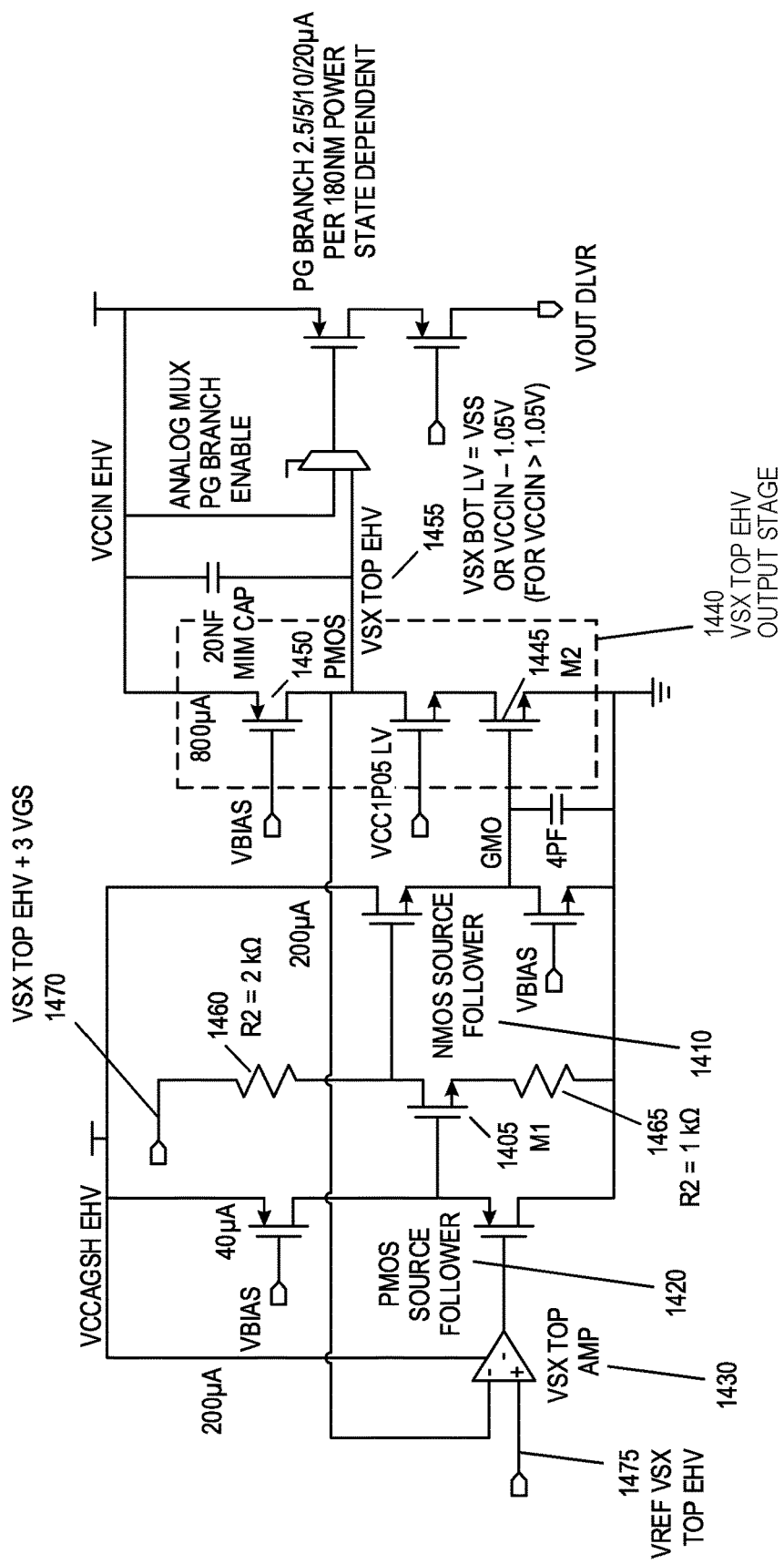
FIG. 14 is a circuit diagram illustrating an NMOS source follower regulation circuit, according to an embodiment.

FIG. 14 is a circuit diagram illustrating a modified Cherry-Hooper NMOS output driver regulation circuit 1400, according to an embodiment. In DLVR applications, driving power gate array PMOS gates as low as possible allows for operation at reduced VCCIN and reduces power consumption. NMOS output driver regulation circuit 1400 combines features of the PMOS source follower regulation circuit 1200 with the modified Cherry-Hooper amplifier 1300, and this combination allows the gain of two cascaded NMOS common sources M1 1405 and M2 1445 to be set such that the loop gain is not significantly increased and stability is maintained.

As shown in FIG. 14, the modified Cherry-Hooper NMOS output driver regulation circuit 1400 includes an NMOS source follower 1410 and a PMOS source follower 1420 that are used to DC level shift internal signals. The NMOS output driver regulation circuit 1400 and the PMOS source follower regulation circuit 1200 may use a common amplifier (1430/1240) and regulation loop. When the gate of the output stage PMOS 1260 is at the supply source voltage (VSS), the VSX TOP amp 1430 output may remain at 1 NMOS VGS. As VSX TOP amp 1430 tries to regulate VSX TOP EHV 1250 and 1455 lower than 1 PMOS VGS, the NMOS M2 1445 within a VSX Top EHV output stage 1440 regulates VSX TOP EHV 1455. The VSX Top EHV output stage 1440 may have an associated 800 µA bias current that is shared with the PMOS source follower 1260. The GM0 may have an associated 1 millimeter of routing on both sides from the center control portion of the DLVR to surrounding power gate arrays and VSX TOP EHV output stages. Driving the VSX Top EHV output stage 1440 and its routing with an NMOS source follower 1410 places its pole at a high frequency while reducing power consumption. The gain from the output of VSX TOP amp 1430 to VSX TOP EHV 1455 may be controlled by the resistor ratio R2 1460/R1 1465=2 kΩ/1 kΩ=6 dB. The gain of the VSX TOP amp 1430 may fall off as its output approaches VSS, so the additional 6 dB gain does not adversely affect stability.

In an example, the Modified Cherry-Hooper NMOS output driver regulation circuit 1400 may not be needed when VSX TOP EHV 1455 is above 1 PMOS VGS. This may reduce power by removing power from the Modified Cherry-Hooper NMOS output driver regulation circuit 1400 at higher voltages. The circuit that provides the VSX TOP EHV+3 VGS 1470 may not be functional at higher values of VSX TOP EHV 1455 due to headroom issues, and may be replaced by a switch capacitor level shifter. A comparator may be used to disable the modified Cherry-Hooper circuitry and deactivate the Modified Cherry-Hooper NMOS output driver regulation circuit 1400, such as when the VSX TOP EHV 1455 reference voltage is at 2 VGS. Conversely, the modified Cherry-Hooper circuitry may be enabled as VREF VSX TOP EHV 1475 goes below 2 VGS. At 1 VGS, the Modified Cherry-Hooper NMOS output driver regulation circuit 1400 may seamlessly take over regulation as the gate of the PMOS source follower 1260 is at VSS and the VSX TOP regulation loop attempts to regulate lower.

Figure 15:
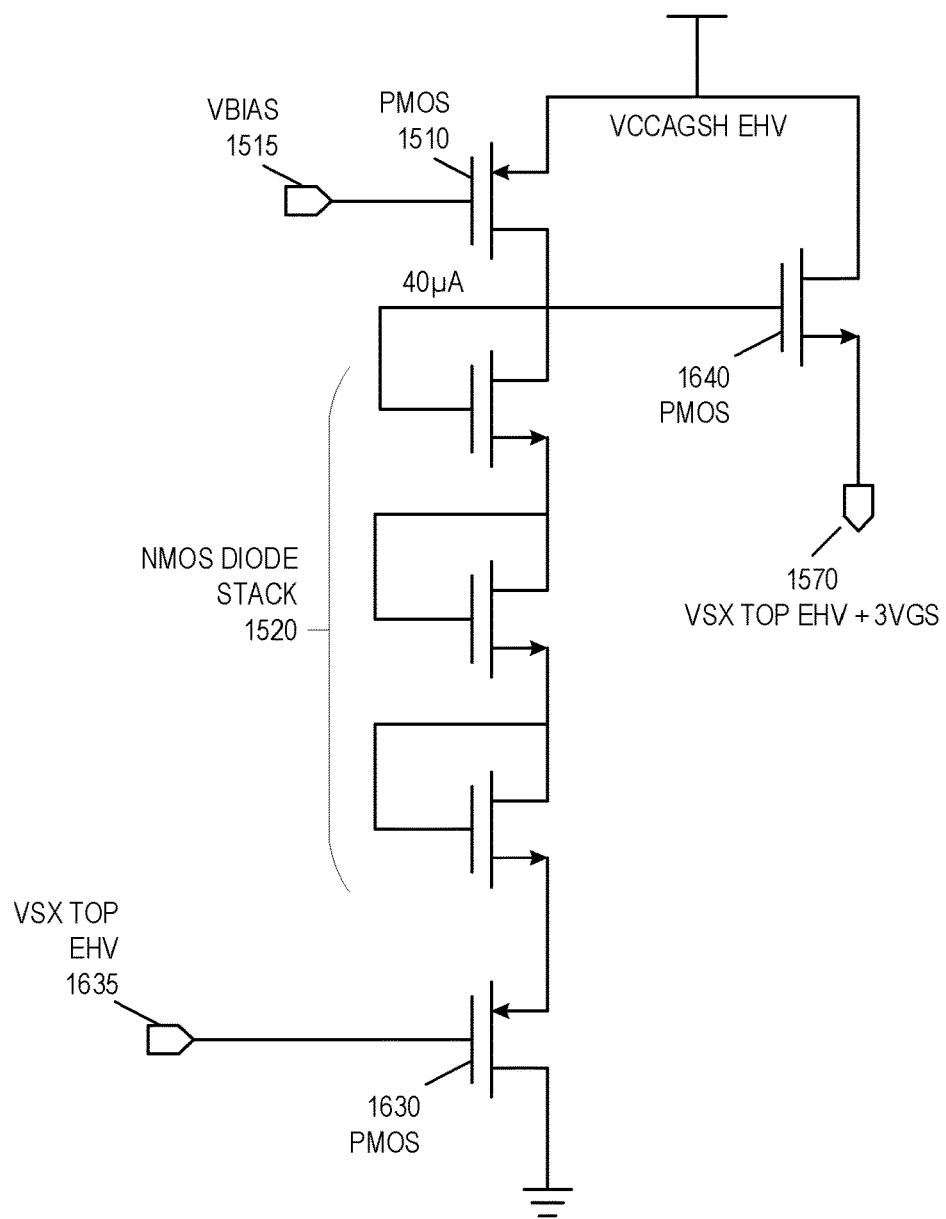
FIG. 15 is a circuit diagram illustrating shifted voltage circuit, according to an embodiment.

FIG. 15 is a circuit diagram illustrating shifted voltage circuit 1500, according to an embodiment. Shifted voltage circuit 1500 may include a PMOS 1510 whose gate is coupled to $V_{bias}$ 1515, an NMOS diode stack 1520, a PMOS 1630 whose gate is coupled to VSX TOP EHV 1635, and PMOS 1640 whose gate is coupled to the NMOS diode stack 1520. The shifted voltage circuit 1500 may be used to generate VSX TOP EHV+3 VGS 1570, which may be used to provide the VSX TOP EHV+3 VGS 1470 in regulation circuit 1400. Because VSX TOP EHV 1455 may have a low DC level (e.g., 100 mV-300 mV), the VSX TOP EHV+3 VGS 1570 may be used to generate shifted voltages needed for the operation of regulation circuit 1400.

Figure 16:
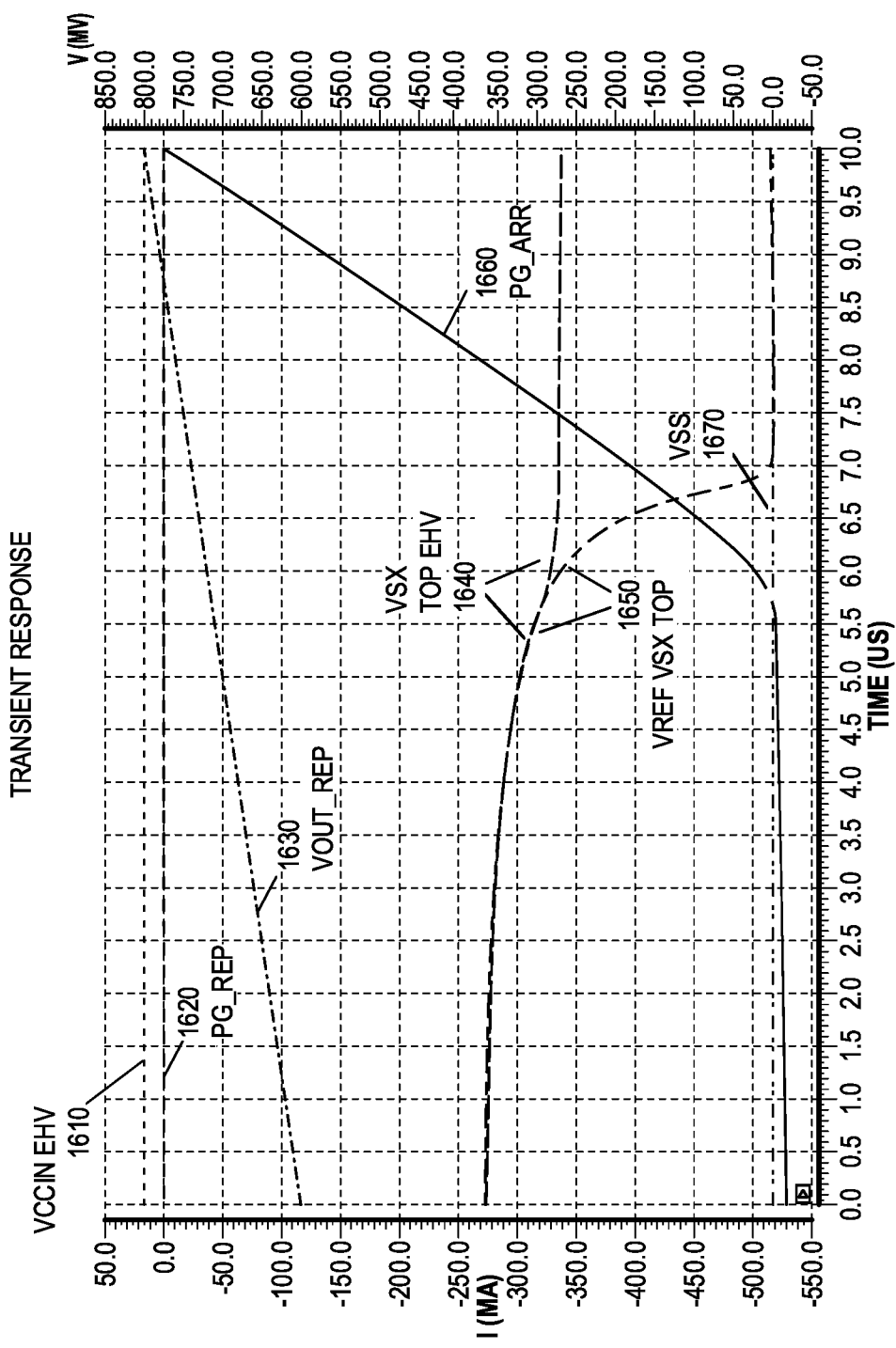
FIG. 16 is a graph illustrating a transient response, according to an embodiment.

FIG. 16 is a graph illustrating a transient response 1600, according to an embodiment. In the graph of the transient response 1600, VCCIN_EHV 1610=800 mV, and VOUT_REP 1630 may sweep from 600 mV to 800 mV, which sweeps the DLVR dropout voltage (e.g., VCCIN_EHV 1610–VOUT_REP 1630) from 200 mV to 0 V. The replica bias current PG_REP 1620 is 80 μA/4 branches. VREF VSX TOP 1650 reduces to VSS 1670 as the dropout is reduced to keep the replica current equal to the input bias current PG_REP 1620 at 80 μA/4 branches. VSX TOP EHV 1640 may be regulated by a PMOS source follower. As VSX TOP EHV 1640 diverges from VREF VSX TOP 1650, the power gate current PG_ARR 1660 rapidly decreases. In an example, almost full branch current can be supplied at 737 mV if VSX TOP EHV 1640 can be regulated down to VSS 1670, and the output voltage can only go as high as 715 mV if VSX TOP EHV 1640 is limited to 1 PMOS VGS for VCCIN EHV 1610=800 mV.

Figure 17A:
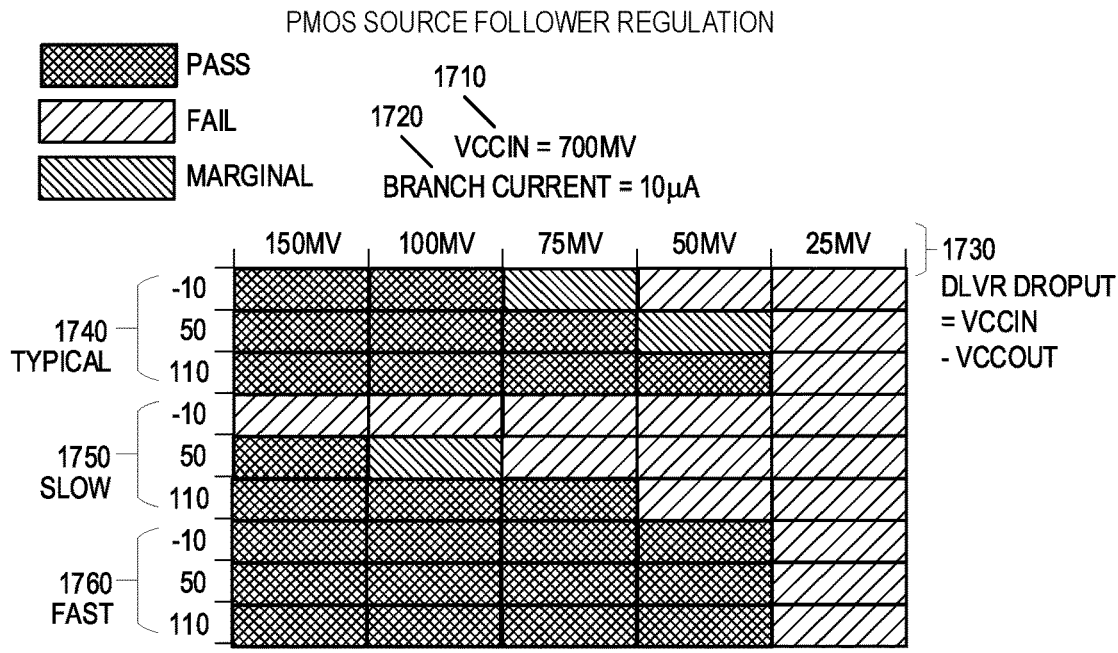
FIGS. 17A-17B are voltage regulation condition grids, according to an embodiment.
Figure 17B:
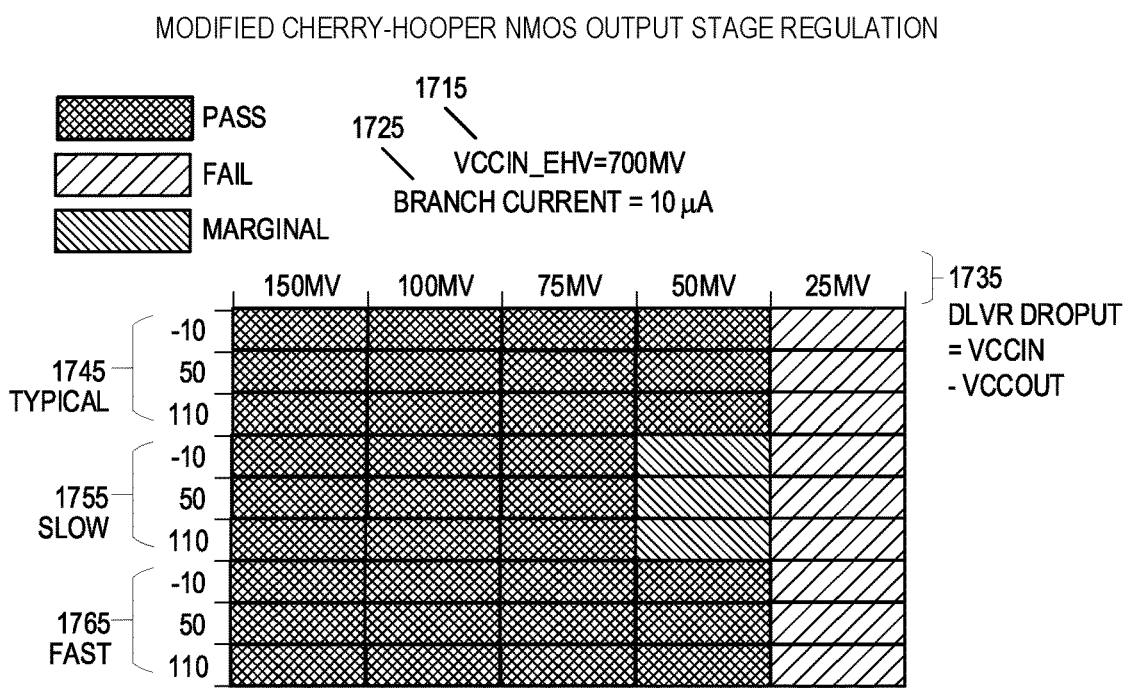

FIGS. 17A-17B are voltage regulation condition grids 1700, according to an embodiment. FIG. 17A shows PMOS source follower regulation, with VCCIN 1710=700 mV and a branch current 1720=10 μA for various dropout values 1730. FIG. 17B shows a modified Cherry-Hooper NMOS output stage regulation, with the same VCCIN 1715=700 mV but with a branch current 1725=10 μA for various dropout values 1735. The y-axis for both FIG. 17A and FIG. 17B show operating conditions of –10° C., 50° C., and 110° C., grouped by typical PMOS 1740 and 1745, slow PMOS 1750 and 1755, and fast PMOS 1760 and 1765. As can be seen in comparing FIG. 17A with FIG. 17B, the modified Cherry-Hooper NMOS output stage regulation provides fewer failure regions and more passing regions. In an example, FIG. 17A shows a failure for all dropout values at –10° C. for slow PMOS 1750, whereas FIG. 17B shows a failure only at 24 mV at –10° C. for slow PMOS 1755.

This increase in passing regions indicates that the modified Cherry-Hooper NMOS output stage regulation is able to provide most of the full branch current at each combination of dropout and environmental condition. The modified Cherry-Hooper NMOS output stage regulation provides improved regulation of VSX TOP EHV as close to VSS as possible, which allows for DLVR operation with smaller dropouts and with more regulation headroom for a given dropout. Once the power gate VDS (e.g., dropout) becomes small enough that the power gate no longer supplies the desired bias current per branch, the delivered output current is significantly reduced for any further reduction in VDS because the PMOS power gate gates can be regulated no lower.

Figure 18:
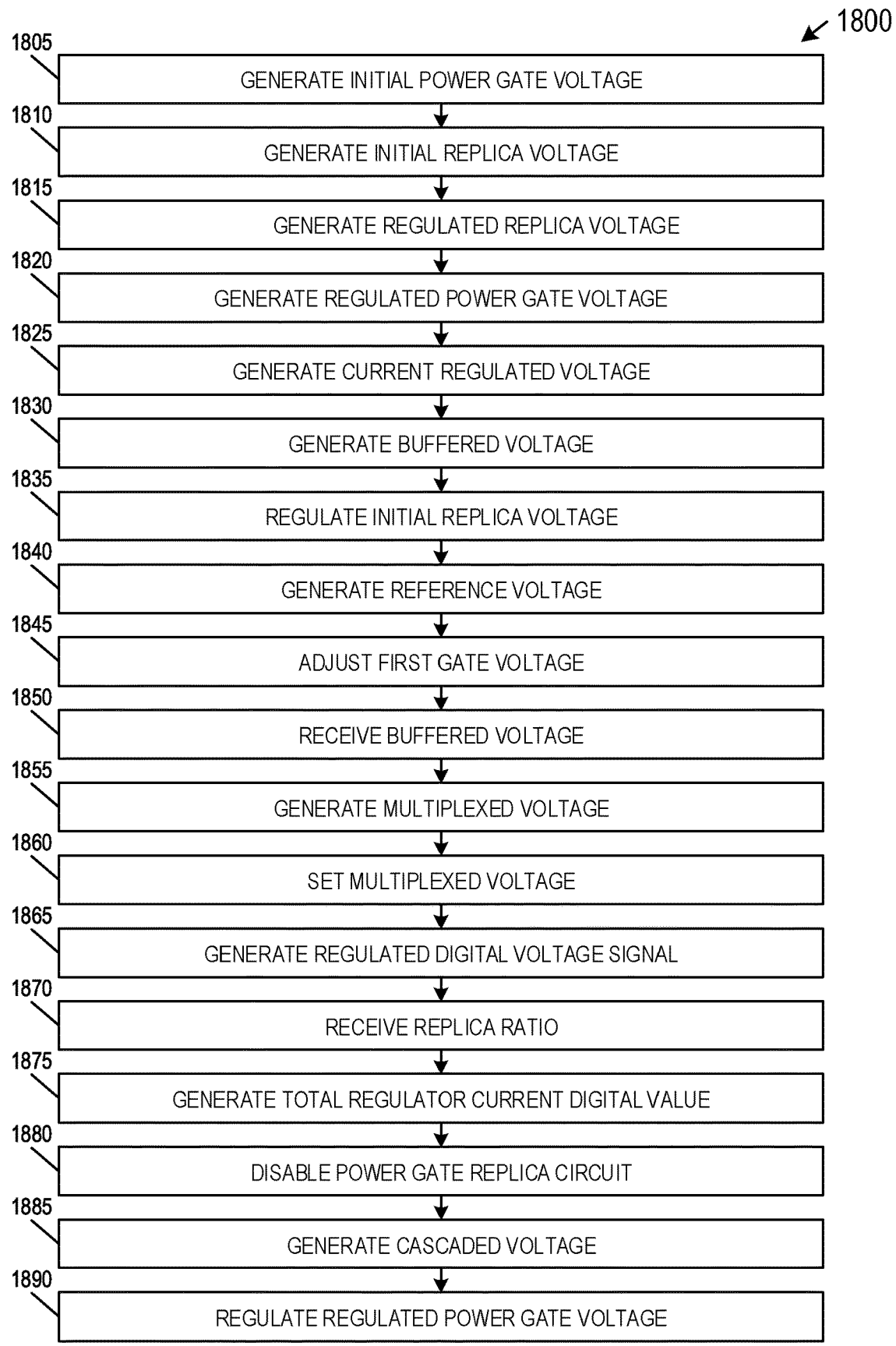
FIG. 18 is a flowchart illustrating a method, according to an embodiment.

FIG. 18 is a flowchart illustrating a method 1800, according to an embodiment. Method 1800 includes generating 1805 an initial power gate voltage at a power gate array, generating 1810 an initial replica voltage at a power gate replica circuit coupled to the power gate array, generating 1815 a regulated replica voltage at a regulation circuit coupled to the power gate array and to the power gate replica circuit, the regulated replica voltage generated based on the initial power gate voltage and the initial replica voltage, and generating 1820 a regulated power gate voltage at the power gate array based on the regulated replica voltage. The power gate replica circuit may include a first transistor coupled to a second transistor, and the regulation circuit may include a first amplifier circuit coupled to a third transistor.

Method 1800 may further include generating 1825 a current regulated voltage at a second amplifier circuit based on the regulated replica voltage, and generating 1830 a buffered voltage at a third amplifier circuit and an output stage based on the current regulated voltage, where generating 1820 the regulated power gate voltage at the power gate array is further based on the buffered voltage. Method 1800 may further include regulating 1835 the initial replica voltage to be substantially equivalent to the initial power gate voltage. Method 1800 may further include generating 1840 a reference voltage at a trimmed current reference, where generating 1825 the current regulated voltage at the second amplifier circuit is further based on the reference voltage. Method 1800 may further include adjusting 1845 a first gate voltage of the first transistor to regulate the regulated replica voltage to be substantially equivalent to the reference voltage. Method 1800 may further include receiving 1850 the buffered voltage at a fourth transistor within the power gate array from the third amplifier circuit and the output stage.

Method 1800 may further include generating 1855 a multiplexed voltage at an analog multiplexer based on the initial power gate voltage and a received setpoint voltage, and generating 1825 the regulated replica voltage at the first amplifier circuit and the third transistor further based on the multiplexed voltage. Method 1800 may further include setting 1860 the multiplexed voltage generated by the multiplexer to the received setpoint voltage when the regulated power gate voltage falls below the received setpoint voltage. Method 1800 may further include generating 1865 a regulated digital voltage signal at an analog-to-digital converter based on the regulated replica voltage. Method 1800 may further include receiving 1870 a replica ratio of an enabled power gate size to a power gate replica size at a multiplier circuit, and generating 1875 a total regulator current digital value at the multiplier circuit based on the replica ratio. Method 1800 may further include reversibly disabling 1880 the power gate replica circuit at a replica multiplexer by pulling a first gate voltage of the first transistor to an input supply voltage, the replica multiplexer within the power gate replica circuit and coupled to the first transistor.

Method 1800 may further include generating 1885 a cascaded voltage at a cascaded amplifier circuit based on a replica node voltage from a replica node conductively coupled between the first transistor and the second transistor, the cascaded amplifier circuit including cascaded n-channel metallic oxide semiconductor NMOS transistors, and generating the regulated power gate voltage at the power gate array further based on the cascaded voltage. Method 1800 may further include regulating 1890 the regulated power gate voltage at the cascaded amplifier circuit when the replica node voltage falls below a supply source voltage. The cascaded amplifier circuit may include a modified Cherry-Hooper amplifier circuit.

Figure 19:
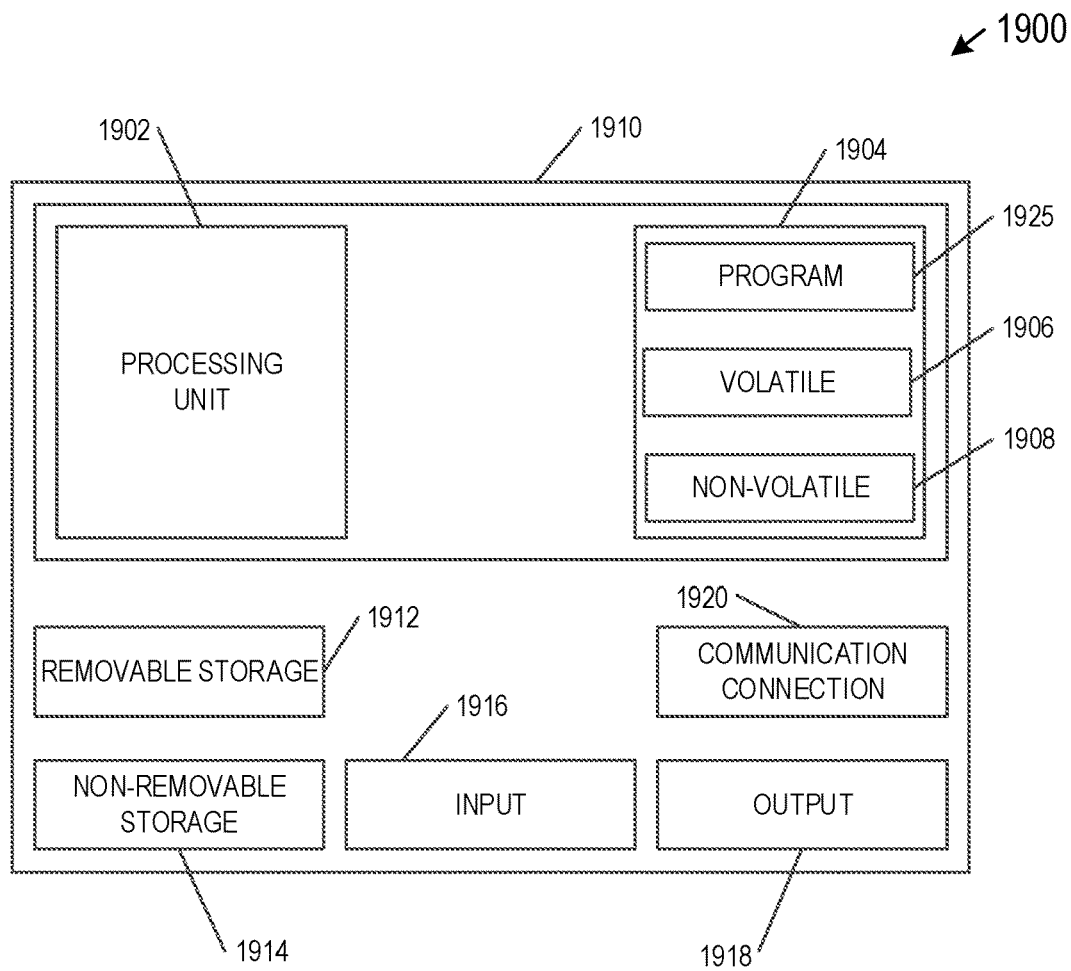
FIG. 19 is a block diagram of a computing device, according to an embodiment.

FIG. 19 is a block diagram of a computing device 1900, according to an embodiment. The performance of one or more components within computing device 1900 may be improved by including one or more of the circuits or circuitry methods described herein. Device 1900 may include a digital linear voltage regulator device comprising: a power gate array, a power gate replica circuit coupled to the power gate array, and a regulation circuit coupled to the power gate array and to the power gate replica circuit, the power gate array to generate a regulated power gate voltage based on a regulated replica voltage generated at the regulation circuit. In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 19 is an example of a client device that may invoke methods described herein over a network. In other embodiments, the computing device is an example of a computing device that may be included in or connected to a motion interactive video projection system, as described elsewhere herein. In some embodiments, the computing device of FIG. 19 is an example of one or more of the personal computer, smartphone, tablet, or various servers.

One example computing device in the form of a computer 1910, may include a processing unit 1902, memory 1904, removable storage 1912, and non-removable storage 1914. Although the example computing device is illustrated and described as computer 1910, the computing device may be in different forms in different embodiments. For example, the computing device may instead be a smartphone, a tablet, or other computing device including the same or similar elements as illustrated and described with regard to FIG. 19. Further, although the various data storage elements are illustrated as part of the computer 1910, the storage may include cloud-based storage accessible via a network, such as the Internet.

Returning to the computer 1910, memory 1904 may include volatile memory 1906 and non-volatile memory 1908. Computer 1910 may include or have access to a computing environment that includes a variety of computer-readable media, such as volatile memory 1906 and non-volatile memory 1908, removable storage 1912 and non-removable storage 1914. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 1910 may include or have access to a computing environment that includes input 1916, output 1918, and a communication connection 1920. The input 1916 may include one or more of a touchscreen, touchpad, mouse, keyboard, camera, and other input devices. The input 1916 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 1920 to connect to one or more remote computers, such as database servers, web servers, and other computing devices. An example remote computer may include a personal computer (PC), server, router, network PC, a peer device or other common network node, or the like. The communication connection 1920 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 1902 of the computer 1910. A hard drive (magnetic disk or solid state), CD-ROM, and RAM are some examples of articles including a non-transitory computer-readable medium. For example, various computer programs 1925 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as subcomponents within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

ADDITIONAL NOTES AND EXAMPLES

Example 1 is a digital linear voltage regulator apparatus comprising: a power gate array to generate an initial power gate voltage; a power gate replica circuit coupled to the power gate array, the power gate replica circuit to generate an initial replica voltage; and a regulation circuit coupled to the power gate array and to the power gate replica circuit, the regulation circuit to generate a regulated replica voltage based on the initial power gate voltage and the initial replica voltage; the power gate array to generate a regulated power gate voltage based on the regulated replica voltage.

In Example 2, the subject matter of Example 1 includes, wherein: the power gate replica circuit includes a first transistor coupled to a second transistor; and the regulation circuit includes a first amplifier circuit coupled to a third transistor.

In Example 3, the subject matter of Example 2 includes a second amplifier circuit to generate a current regulated voltage based on the regulated replica voltage; and a third amplifier circuit and an output stage to generate a buffered voltage based on the current regulated voltage; the power gate array to generate the regulated power gate voltage further based on the buffered voltage.

In Example 4, the subject matter of Example 3 includes, wherein the first amplifier circuit and the third transistor generating the regulated replica voltage includes regulating the initial replica voltage to be substantially equivalent to the initial power gate voltage.

In Example 5, the subject matter of Examples 3-4 includes a trimmed current reference to generate a reference voltage, the second amplifier circuit further to generate the current regulated voltage based on the reference voltage.

In Example 6, the subject matter of Example 5 includes, wherein the second amplifier circuit generating a current regulated voltage includes adjusting a first gate voltage of the first transistor to regulate the regulated replica voltage to be substantially equivalent to the reference voltage.

In Example 7, the subject matter of Examples 3-6 includes, wherein the power gate array includes a fourth transistor to receive the buffered voltage from the third amplifier circuit and the output stage.

In Example 8, the subject matter of Examples 3-7 includes an analog multiplexer to generate a multiplexed voltage based on the initial power gate voltage and a received setpoint voltage, the first amplifier circuit and the third transistor to generate the regulated replica voltage further based on the multiplexed voltage.

In Example 9, the subject matter of Example 8 includes, wherein the multiplexed voltage generated by the multiplexer is set to the received setpoint voltage when the regulated power gate voltage falls below the received setpoint voltage.

In Example 10, the subject matter of Examples 2-9 includes an analog-to-digital converter to generate a regulated digital voltage signal based on the regulated replica voltage.

In Example 11, the subject matter of Examples 2-10 includes a multiplier circuit to: receive a replica ratio of an enabled power gate size to a power gate replica size; and generate a total regulator current digital value based on the replica ratio.

In Example 12, the subject matter of Examples 2-11 includes, wherein the power gate replica circuit further includes a replica multiplexer coupled to the first transistor, the replica multiplexer to reversibly disable the power gate replica circuit by pulling a first gate voltage of the first transistor to an input supply voltage.

In Example 13, the subject matter of Examples 2-12 includes, a cascaded amplifier circuit including cascaded n-channel metallic oxide semiconductor NMOS transistors, the cascaded amplifier circuit to generate a cascaded voltage based on a replica node voltage from a replica node conductively coupled between the first transistor and the second transistor, the power gate array to generate the regulated power gate voltage further based on the cascaded voltage.

In Example 14, the subject matter of Example 13 includes, wherein the cascaded amplifier circuit is to regulate the regulated power gate voltage when the replica node voltage falls below a supply source voltage.

In Example 15, the subject matter of Examples 13-14 includes, wherein the cascaded amplifier circuit includes a modified Cherry-Hooper amplifier circuit.

Example 16 is a digital linear voltage regulator method comprising: generating an initial power gate voltage at a power gate array; generating an initial replica voltage at a power gate replica circuit coupled to the power gate array; generating a regulated replica voltage at a regulation circuit coupled to the power gate array and to the power gate replica circuit, the regulated replica voltage generated based on the initial power gate voltage and the initial replica voltage; and generating a regulated power gate voltage at the power gate array based on the regulated replica voltage.

In Example 17, the subject matter of Example 16 includes, wherein: the power gate replica circuit includes a first transistor coupled to a second transistor; and the regulation circuit includes a first amplifier circuit coupled to a third transistor.

In Example 18, the subject matter of Example 17 includes, generating a current regulated voltage at a second amplifier circuit based on the regulated replica voltage; and generating a buffered voltage at a third amplifier circuit and an output stage based on the current regulated voltage; generating the regulated power gate voltage at the power gate array further based on the buffered voltage.

In Example 19, the subject matter of Example 18 includes, regulating the initial replica voltage to be substantially equivalent to the initial power gate voltage.

In Example 20, the subject matter of Examples 18-19 includes, generating a reference voltage at a trimmed current reference; and generating the current regulated voltage at the second amplifier circuit further based on the reference voltage.

In Example 21, the subject matter of Example 20 includes, adjusting a first gate voltage of the first transistor to regulate the regulated replica voltage to be substantially equivalent to the reference voltage.

In Example 22, the subject matter of Examples 18-21 includes, receiving the buffered voltage at a fourth transistor within the power gate array from the third amplifier circuit and the output stage.

In Example 23, the subject matter of Examples 18-22 includes, generating a multiplexed voltage at an analog multiplexer based on the initial power gate voltage and a received setpoint voltage; and generating the regulated replica voltage at the first amplifier circuit and the third transistor further based on the multiplexed voltage.

In Example 24, the subject matter of Example 23 includes, setting the multiplexed voltage generated by the multiplexer to the received setpoint voltage when the regulated power gate voltage falls below the received setpoint voltage.

In Example 25, the subject matter of Examples 17-24 includes, generating a regulated digital voltage signal at an analog-to-digital converter based on the regulated replica voltage.

In Example 26, the subject matter of Examples 17-25 includes, receiving a replica ratio of an enabled power gate size to a power gate replica size at a multiplier circuit; and generating a total regulator current digital value at the multiplier circuit based on the replica ratio.

In Example 27, the subject matter of Examples 17-26 includes, reversibly disabling the power gate replica circuit at a replica multiplexer by pulling a first gate voltage of the first transistor to an input supply voltage, the replica multiplexer within the power gate replica circuit and coupled to the first transistor.

In Example 28, the subject matter of Examples 17-27 includes, generating a cascaded voltage at a cascaded amplifier circuit based on a replica node voltage from a replica node conductively coupled between the first transistor and the second transistor, the cascaded amplifier circuit including cascaded n-channel metallic oxide semiconductor NMOS transistors; and generating the regulated power gate voltage at the power gate array further based on the cascaded voltage.

In Example 29, the subject matter of Example 28 includes, regulating the regulated power gate voltage at the cascaded amplifier circuit when the replica node voltage falls below a supply source voltage.

In Example 30, the subject matter of Examples 28-29 includes, wherein the cascaded amplifier circuit includes a modified Cherry-Hooper amplifier circuit.

Example 31 is at least one non-transitory machine-readable storage medium, comprising a plurality of instructions that, responsive to being executed with processor circuitry of a computer-controlled device, cause the processing circuitry to: generate an initial power gate voltage at a power gate array; generate an initial replica voltage at a power gate replica circuit coupled to the power gate array; generate a regulated replica voltage at a regulation circuit coupled to the power gate array and to the power gate replica circuit, the regulated replica voltage generated based on the initial power gate voltage and the initial replica voltage; and generate a regulated power gate voltage at the power gate array based on the regulated replica voltage.

In Example 32, the subject matter of Example 31 includes, wherein: the power gate replica circuit includes a first transistor coupled to a second transistor; and the regulation circuit includes a first amplifier circuit coupled to a third transistor.

In Example 33, the subject matter of Example 32 includes, the instructions further causing the processing circuitry to: generate a current regulated voltage at a second amplifier circuit based on the regulated replica voltage; and generate a buffered voltage at a third amplifier circuit and an output stage based on the current regulated voltage; generate the regulated power gate voltage at the power gate array further based on the buffered voltage.

In Example 34, the subject matter of Example 33 includes, the instructions further causing the processing circuitry to regulate the initial replica voltage to be substantially equivalent to the initial power gate voltage.

In Example 35, the subject matter of Examples 33-34 includes, the instructions further causing the processing circuitry to: generate a reference voltage at a trimmed current reference; and generate the current regulated voltage at the second amplifier circuit further based on the reference voltage.

In Example 36, the subject matter of Example 35 includes, the instructions further causing the processing circuitry to adjust a first gate voltage of the first transistor to regulate the regulated replica voltage to be substantially equivalent to the reference voltage.

In Example 37, the subject matter of Examples 33-36 includes, the instructions further causing the processing circuitry to receive the buffered voltage at a fourth transistor within the power gate array from the third amplifier circuit and the output stage.

In Example 38, the subject matter of Examples 33-37 includes, the instructions further causing the processing circuitry to: generate a multiplexed voltage at an analog multiplexer based on the initial power gate voltage and a received setpoint voltage; and generate the regulated replica voltage at the first amplifier circuit and the third transistor further based on the multiplexed voltage.

In Example 39, the subject matter of Example 38 includes, the instructions further causing the processing circuitry to set the multiplexed voltage generated by the multiplexer to the received setpoint voltage when the regulated power gate voltage falls below the received setpoint voltage.

In Example 40, the subject matter of Examples 32-39 includes, the instructions further causing the processing circuitry to generate a regulated digital voltage signal at an analog-to-digital converter based on the regulated replica voltage.

In Example 41, the subject matter of Examples 32-40 includes, the instructions further causing the processing circuitry to: receive a replica ratio of an enabled power gate size to a power gate replica size at a multiplier circuit; and generate a total regulator current digital value at the multiplier circuit based on the replica ratio.

In Example 42, the subject matter of Examples 32-41 includes, the instructions further causing the processing circuitry to reversibly disable the power gate replica circuit at a replica multiplexer by pulling a first gate voltage of the first transistor to an input supply voltage, the replica multiplexer within the power gate replica circuit and coupled to the first transistor.

In Example 43, the subject matter of Examples 32-42 includes, the instructions further causing the processing circuitry to: generate a cascaded voltage at a cascaded amplifier circuit based on a replica node voltage from a replica node conductively coupled between the first transistor and the second transistor, the cascaded amplifier circuit including cascaded n-channel metallic oxide semiconductor NMOS transistors; and generate the regulated power gate voltage at the power gate array further based on the cascaded voltage.

In Example 44, the subject matter of Example 43 includes, the instructions further causing the processing circuitry to regulate the regulated power gate voltage at the cascaded amplifier circuit when the replica node voltage falls below a supply source voltage.

In Example 45, the subject matter of Examples 43-44 includes, wherein the cascaded amplifier circuit includes a modified Cherry-Hooper amplifier circuit.

Example 46 is an apparatus for digital linear voltage regulation, the apparatus comprising: means for generating an initial power gate voltage at a power gate array; means for generating an initial replica voltage at a power gate replica circuit coupled to the power gate array; means for generating a regulated replica voltage at a regulation circuit coupled to the power gate array and to the power gate replica circuit, the regulated replica voltage generated based on the initial power gate voltage and the initial replica voltage; and means for generating a regulated power gate voltage at the power gate array based on the regulated replica voltage.

In Example 47, the subject matter of Example 46 includes, wherein: the power gate replica circuit includes a first transistor coupled to a second transistor; and the regulation circuit includes a first amplifier circuit coupled to a third transistor.

In Example 48, the subject matter of Example 47 includes, means for generating a current regulated voltage at a second amplifier circuit based on the regulated replica voltage; and means for generating a buffered voltage at a third amplifier circuit and an output stage based on the current regulated voltage; means for generating the regulated power gate voltage at the power gate array further based on the buffered voltage.

In Example 49, the subject matter of Example 48 includes, means for regulating the initial replica voltage to be substantially equivalent to the initial power gate voltage.

In Example 50, the subject matter of Examples 48-49 includes, means for generating a reference voltage at a trimmed current reference; and means for generating the current regulated voltage at the second amplifier circuit further based on the reference voltage.

In Example 51, the subject matter of Example 50 includes, means for adjusting a first gate voltage of the first transistor to regulate the regulated replica voltage to be substantially equivalent to the reference voltage.

In Example 52, the subject matter of Examples 48-51 includes, means for receiving the buffered voltage at a fourth transistor within the power gate array from the third amplifier circuit and the output stage.

In Example 53, the subject matter of Examples 48-52 includes, means for generating a multiplexed voltage at an analog multiplexer based on the initial power gate voltage and a received setpoint voltage; and means for generating the regulated replica voltage at the first amplifier circuit and the third transistor further based on the multiplexed voltage.

In Example 54, the subject matter of Example 53 includes, means for setting the multiplexed voltage generated by the multiplexer to the received setpoint voltage when the regulated power gate voltage falls below the received setpoint voltage.

In Example 55, the subject matter of Examples 47-54 includes, means for means for generating a regulated digital voltage signal at an analog-to-digital converter based on the regulated replica voltage.

In Example 56, the subject matter of Examples 47-55 includes, means for receiving a replica ratio of an enabled power gate size to a power gate replica size at a multiplier circuit; and means for generating a total regulator current digital value at the multiplier circuit based on the replica ratio.

In Example 57, the subject matter of Examples 47-56 includes, means for reversibly disabling the power gate replica circuit at a replica multiplexer by pulling a first gate voltage of the first transistor to an input supply voltage, the replica multiplexer within the power gate replica circuit and coupled to the first transistor.

In Example 58, the subject matter of Examples 47-57 includes, means for generating a cascaded voltage at a cascaded amplifier circuit based on a replica node voltage from a replica node conductively coupled between the first transistor and the second transistor, the cascaded amplifier circuit including cascaded n-channel metallic oxide semiconductor NMOS transistors; and means for generating the regulated power gate voltage at the power gate array further based on the cascaded voltage.

In Example 59, the subject matter of Example 58 includes, means for regulating the regulated power gate voltage at the cascaded amplifier circuit when the replica node voltage falls below a supply source voltage.

In Example 60, the subject matter of Examples 58-59 includes, wherein the cascaded amplifier circuit includes a modified Cherry-Hooper amplifier circuit.

Example 61 is a digital linear voltage regulator device comprising: a power gate array; a power gate replica circuit coupled to the power gate array; and a regulation circuit coupled to the power gate array and to the power gate replica circuit; the power gate array to generate a regulated power gate voltage based on a regulated replica voltage generated at the regulation circuit.

In Example 62, the subject matter of Example 61 includes, wherein: the power gate replica circuit includes a first transistor coupled to a second transistor; and the regulation circuit includes a first amplifier circuit coupled to a third transistor.

In Example 63, the subject matter of Example 62 includes, a second amplifier circuit coupled to the regulation circuit; and a buffer circuit coupled between the power gate replica circuit and the power gate array.

In Example 64, the subject matter of Example 63 includes, a trimmed current reference coupled to the second amplifier circuit.

In Example 65, the subject matter of Examples 63-64 includes a fourth transistor within the power gate array coupled to the buffer circuit.

In Example 66, the subject matter of Examples 63-65 includes an analog multiplexer within the power gate array coupled between the buffer circuit and the fourth transistor.

In Example 67, the subject matter of Examples 62-66 includes, an analog-to-digital converter coupled to the power gate array and to the power gate replica circuit.

In Example 68, the subject matter of Examples 62-67 includes, a multiplier circuit coupled to the analog-to-digital converter.

In Example 69, the subject matter of Examples 62-68 includes a replica multiplexer within the power gate replica circuit coupled to the first transistor.

In Example 70, the subject matter of Examples 62-69 includes, a cascaded amplifier circuit including cascaded n-channel metallic oxide semiconductor NMOS transistors; and a replica node coupled between the first transistor and the second transistor.

In Example 71, the subject matter of Example 70 includes, wherein the cascaded amplifier circuit includes a modified Cherry-Hooper amplifier circuit.

Example 72 is at least one machine-readable medium including instructions that, when executed by processing circuitry, cause the processing circuitry to perform operations to implement of any of Examples 1-71.

Example 73 is an apparatus comprising means to implement of any of Examples 1-71.

Example 74 is a system to implement of any of Examples 1-71.

Example 75 is a method to implement of any of Examples 1-71.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. A digital linear voltage regulator apparatus comprising:
   a power gate array to generate an initial power gate voltage;
   a power gate replica circuit coupled to the power gate array, the power gate replica circuit to generate an initial replica voltage; and
   a regulation circuit coupled to the power gate array and to the power gate replica circuit, the regulation circuit to generate a regulated replica voltage based on the initial power gate voltage and the initial replica voltage;
   the power gate array to generate a regulated power gate voltage based on the regulated replica voltage, wherein the power gate replica circuit includes a first transistor coupled to a second transistor, and the regulation circuit includes:
      a first amplifier circuit coupled to a third transistor,
      a second amplifier circuit to generate a current regulated voltage based on the regulated replica voltage; and
      a third amplifier circuit and an output stage to generate a buffered voltage based on the current regulated voltage, the power gate array to generate the regulated power gate voltage further based on the buffered voltage.

2. The apparatus of claim 1, wherein the first amplifier circuit and the third transistor generating the regulated replica voltage includes regulating the initial replica voltage to be substantially equivalent to the initial power gate voltage.

3. The apparatus of claim 1, further including a trimmed current reference to generate a reference voltage, the second amplifier circuit further to generate the current regulated voltage based on the reference voltage.

4. The apparatus of claim 3, wherein the second amplifier circuit generating the current regulated voltage includes adjusting a first gate voltage of the first transistor to regulate the regulated replica voltage to be substantially equivalent to the reference voltage.

5. The apparatus of claim 1, wherein the power gate array includes a fourth transistor to receive the buffered voltage from the third amplifier circuit and the output stage.

6. The apparatus of claim 1, further including an analog-to-digital converter to generate a regulated digital voltage signal based on the regulated replica voltage.

7. The apparatus of claim 1, further including a multiplier circuit to:
   receive a replica ratio of an enabled power gate size to a power gate replica size; and
   generate a total regulator current digital value based on the replica ratio.

8. The apparatus of claim 1, wherein the power gate replica circuit further includes a replica multiplexer coupled to the first transistor, the replica multiplexer to reversibly disable the power gate replica circuit by pulling a first gate voltage of the first transistor to an input supply voltage.

9. The apparatus of claim 1, further including a cascaded amplifier circuit including cascaded n-channel metallic oxide semiconductor NMOS transistors, the cascaded amplifier circuit to generate a cascaded voltage based on a replica node voltage from a replica node conductively coupled between the first transistor and the second transistor, the power gate array to generate the regulated power gate voltage further based on the cascaded voltage.

10. The apparatus of claim 9, wherein the cascaded amplifier circuit is to regulate the regulated power gate voltage when the replica node voltage falls below a supply source voltage.

11. The apparatus of claim 9, wherein the cascaded amplifier circuit includes a modified Cherry-Hooper amplifier circuit.

12. A digital linear voltage regulator method comprising:
   generating an initial power gate voltage at a power gate array;
   generating an initial replica voltage at a power gate replica circuit coupled to the power gate array, the power gate replica circuit including a first transistor coupled to a second transistor;
   generating a regulated replica voltage at a regulation circuit coupled to the power gate array and to the power gate replica circuit, the regulated replica voltage generated based on the initial power gate voltage and the initial replica voltage, the regulation circuit including a first amplifier circuit coupled to a third transistor;
   generating a regulated power gate voltage at the power gate array based on the regulated replica voltage;
   generating a current regulated voltage at a second amplifier circuit based on the regulated replica voltage;
   generating a buffered voltage at a third amplifier circuit and an output stage based on the current regulated voltage; and generating the regulated power gate voltage at the power gate array further based on the buffered voltage.

13. A digital linear voltage regulator device comprising:
a power gate array;
a power gate replica circuit coupled to the power gate array; and
a regulation circuit coupled to the power gate array and to the power gate replica circuit, wherein the power gate replica circuit includes a first transistor coupled to a second transistor, and the regulation circuit includes a first amplifier circuit coupled to a third transistor, the device including a second amplifier circuit coupled to the regulation circuit and a buffer circuit coupled between the power gate replica circuit and the power gate array, the power gate array to generate a regulated power gate voltage based on a regulated replica voltage generated at the regulation circuit.

14. The digital linear voltage regulator device of claim 13, further including:
a cascaded amplifier circuit including cascaded n-channel metallic oxide semiconductor NMOS transistors; and
a replica node coupled between the first transistor and the second transistor.

* * * * *